(12) United States Patent
Yamashita

(10) Patent No.: US 10,553,603 B2
(45) Date of Patent: Feb. 4, 2020

(54) SEMICONDUCTOR DEVICE AND METHOD FOR MANUFACTURING SEMICONDUCTOR DEVICE

(71) Applicant: Toshiba Memory Corporation, Minato-ku (JP)

(72) Inventor: Tetsuya Yamashita, Yokkaichi (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/043,731

(22) Filed: Jul. 24, 2018

(65) Prior Publication Data
US 2019/0279996 A1 Sep. 12, 2019

(30) Foreign Application Priority Data
Mar. 9, 2018 (JP) ................. 2018-043173

(51) Int. Cl.
*H01L 27/11573* (2017.01)
*H01L 27/11529* (2017.01)
(Continued)

(52) U.S. Cl.
CPC .. *H01L 27/11573* (2013.01); *H01L 21/76805* (2013.01); *H01L 21/76816* (2013.01); *H01L 21/8221* (2013.01); *H01L 27/0688* (2013.01); *H01L 27/1158* (2013.01); *H01L 27/11529* (2013.01); *H01L 27/11556* (2013.01);
(Continued)

(58) Field of Classification Search
CPC ............. H01L 21/8221; H01L 27/0688; H01L 27/11517; H01L 27/11519; H01L 27/11521; H01L 27/11526; H01L 27/11551; H01L 27/11553; H01L 27/11556; H01L 27/11563; H01L 27/11565; H01L 27/11568;
(Continued)

(56) References Cited

U.S. PATENT DOCUMENTS 5,635,423 A   6/1997  Huang et al.
5,828,120 A * 10/1998  Ishikawa ........... H01L 21/76229
                                                              257/499
(Continued)

FOREIGN PATENT DOCUMENTS

JP  2004-047754  2/2004
JP  2013-131580  7/2013

*Primary Examiner* — Eduardo A Rodela
(74) *Attorney, Agent, or Firm* — Oblon, McClelland, Maier & Neustadt, L.L.P.

(57) ABSTRACT

A semiconductor device according to an embodiment includes a substrate, first to third conductors, and first and second contacts. The first conductor is provided in a first layer above the substrate. The first contact extends in a first direction, and is provided on the first conductor. The second conductor is provided in the first layer and is insulated from the first conductor. The third conductor is provided between the second conductor and the substrate. The second contact extends in the first direction through the second conductor, and is provided on the third conductor. A width of the second contact, as viewed in a second direction, differs between a portion above a boundary face that is included in the first layer and is parallel to the surface of the substrate, and a portion that is below the boundary face.

17 Claims, 25 Drawing Sheets

(51) Int. Cl.
  *H01L 27/11582* (2017.01)
  *H01L 21/768* (2006.01)
  *H01L 27/11556* (2017.01)
  *H01L 21/28* (2006.01)
  *H01L 21/822* (2006.01)
  *H01L 27/1158* (2017.01)
  *H01L 27/11578* (2017.01)
  *H01L 27/06* (2006.01)

(52) U.S. Cl.
  CPC .. *H01L 27/11578* (2013.01); *H01L 27/11582* (2013.01); *H01L 29/40117* (2019.08)

(58) Field of Classification Search
  CPC ......... H01L 27/11573; H01L 27/11578; H01L 27/1158; H01L 27/11582
  See application file for complete search history.

(56) References Cited

U.S. PATENT DOCUMENTS

| | | | |
|---|---|---|---|
| 9,673,213 B1* | 6/2017 | Yu | H01L 23/535 |
| 9,865,549 B2* | 1/2018 | Shigetoshi | H01L 27/14634 |
| 2004/0009641 A1 | 1/2004 | Kawase | |
| 2009/0267128 A1 | 10/2009 | Maejima | |
| 2009/0268522 A1 | 10/2009 | Maejima | |
| 2010/0207195 A1* | 8/2010 | Fukuzumi | G11C 16/0483 257/326 |
| 2011/0284943 A1* | 11/2011 | Hwang | H01L 27/0207 257/314 |
| 2011/0284946 A1 | 11/2011 | Kiyotoshi | |
| 2013/0056850 A1* | 3/2013 | Kume | H01L 27/10808 257/532 |
| 2013/0228848 A1 | 9/2013 | Nansei | |
| 2016/0071876 A1* | 3/2016 | Mizuno | H01L 27/11582 365/185.17 |
| 2016/0079255 A1 | 3/2016 | Sonehara et al. | |
| 2016/0148835 A1* | 5/2016 | Shimabukuro | H01L 27/11556 257/314 |
| 2017/0077117 A1 | 3/2017 | Vegunta et al. | |
| 2017/0077127 A1* | 3/2017 | Noda | H01L 27/11582 |
| 2017/0117289 A1 | 4/2017 | Liu et al. | |
| 2018/0053768 A1* | 2/2018 | Kim | G11C 16/08 |
| 2018/0358370 A1* | 12/2018 | Hwang | H01L 23/528 |
| 2018/0366482 A1* | 12/2018 | Zhou | H01L 27/11556 |
| 2019/0035733 A1* | 1/2019 | Park | H01L 23/535 |

* cited by examiner

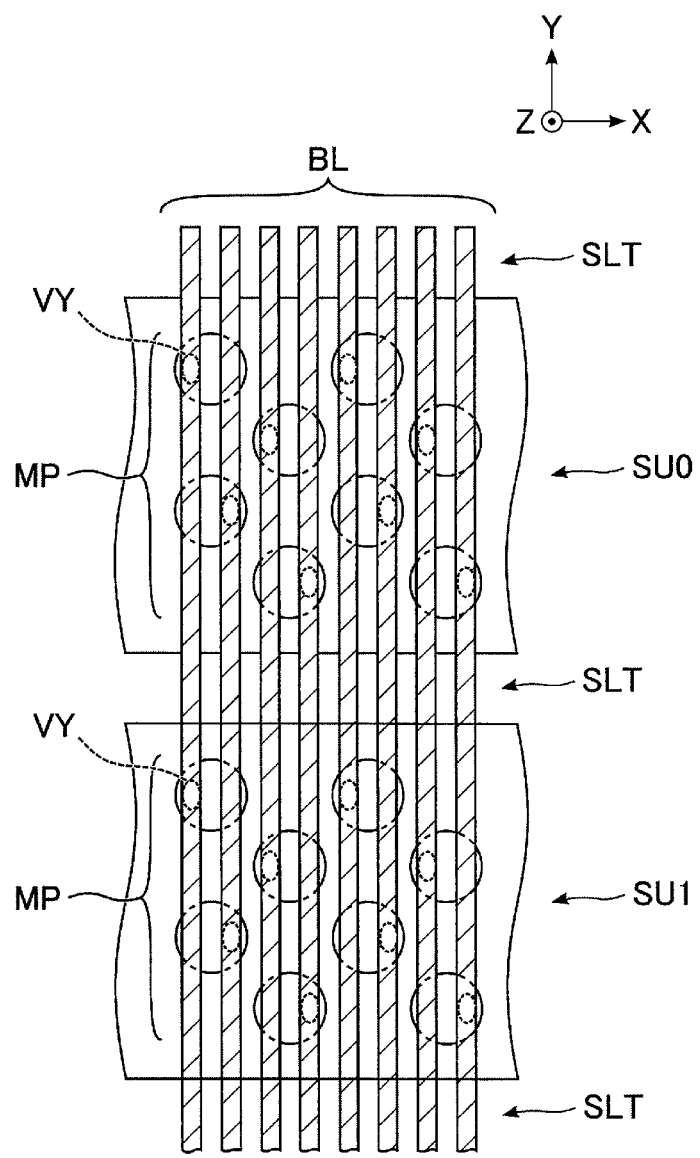
F I G. 5

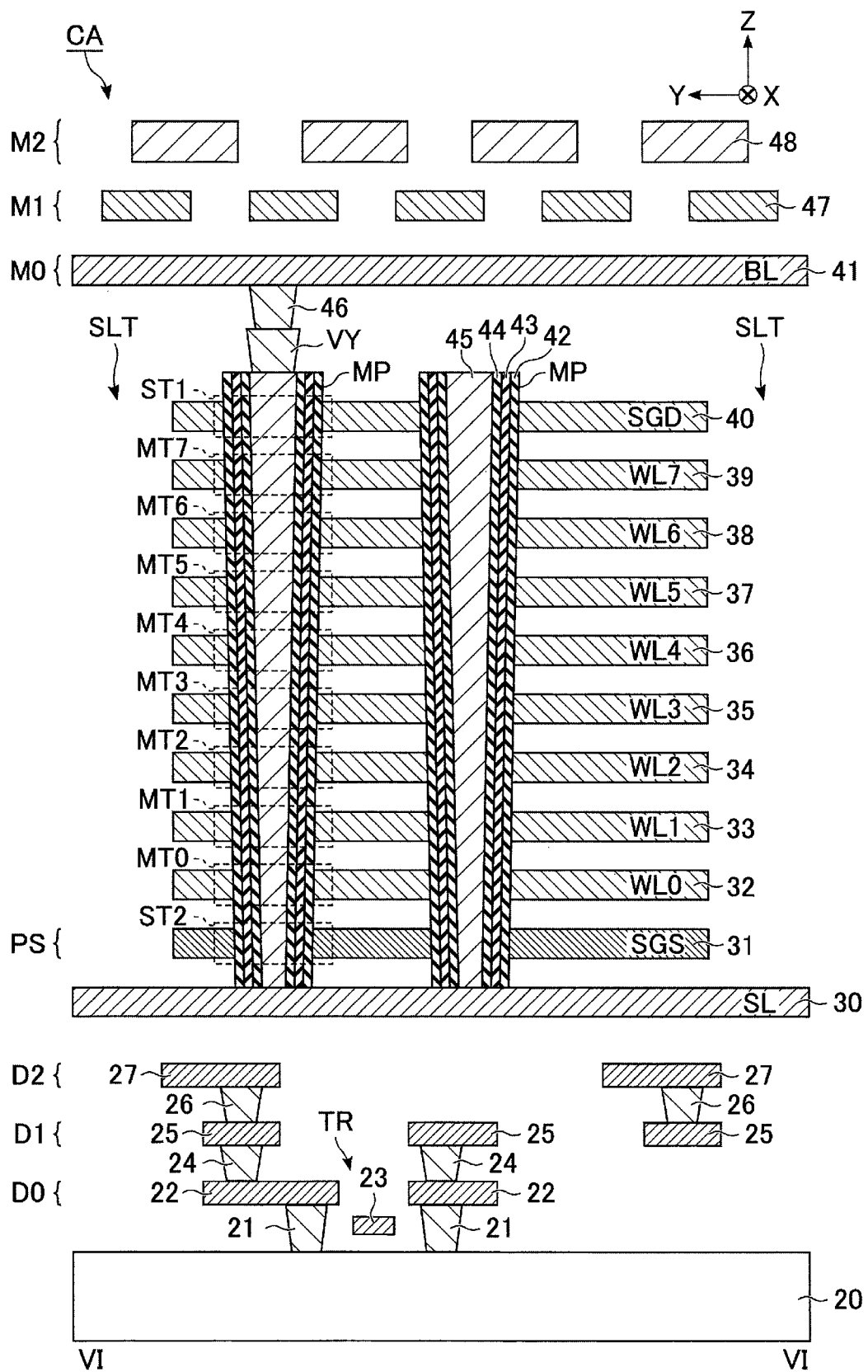
F I G. 6

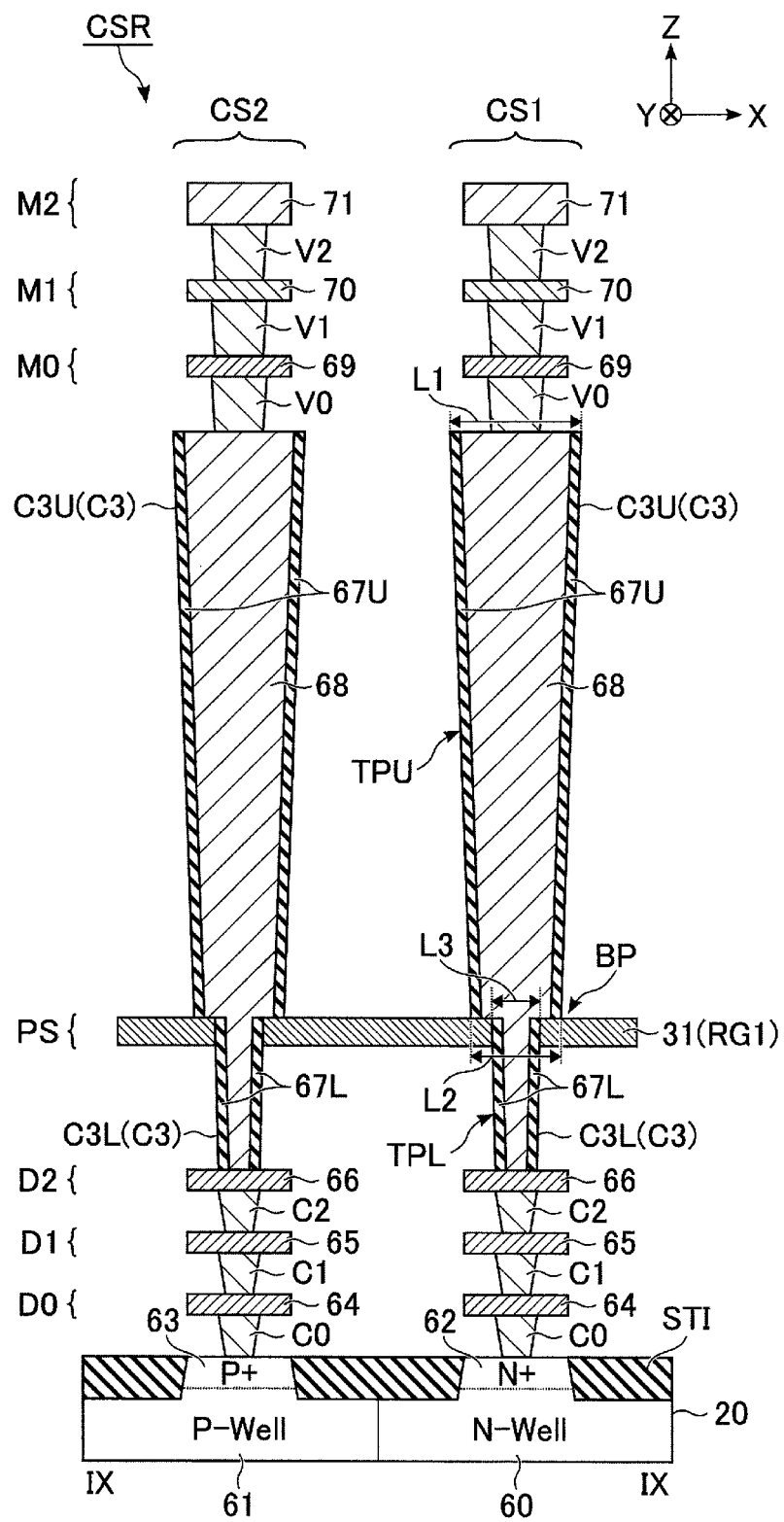
F I G. 9

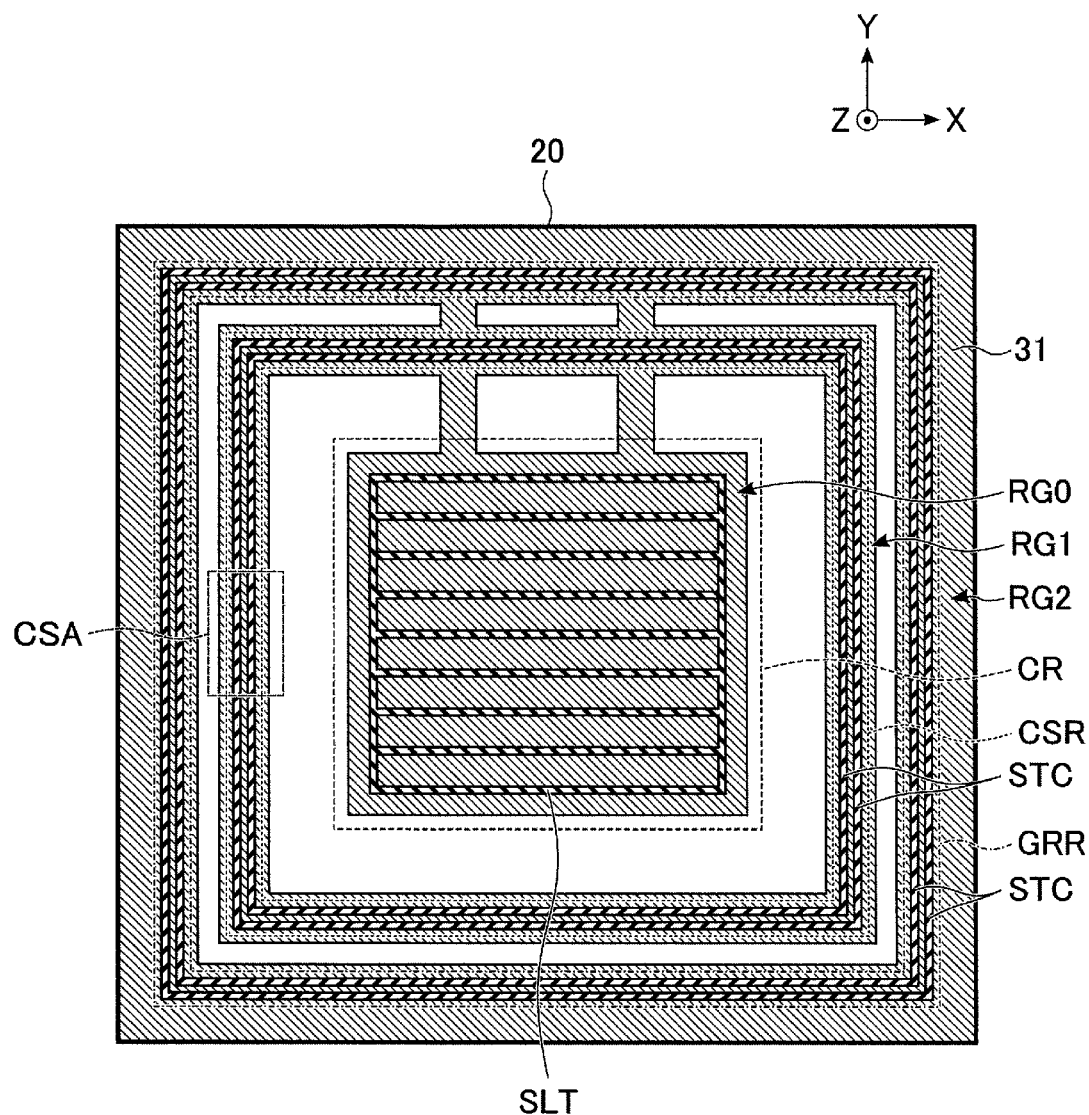
F I G. 17

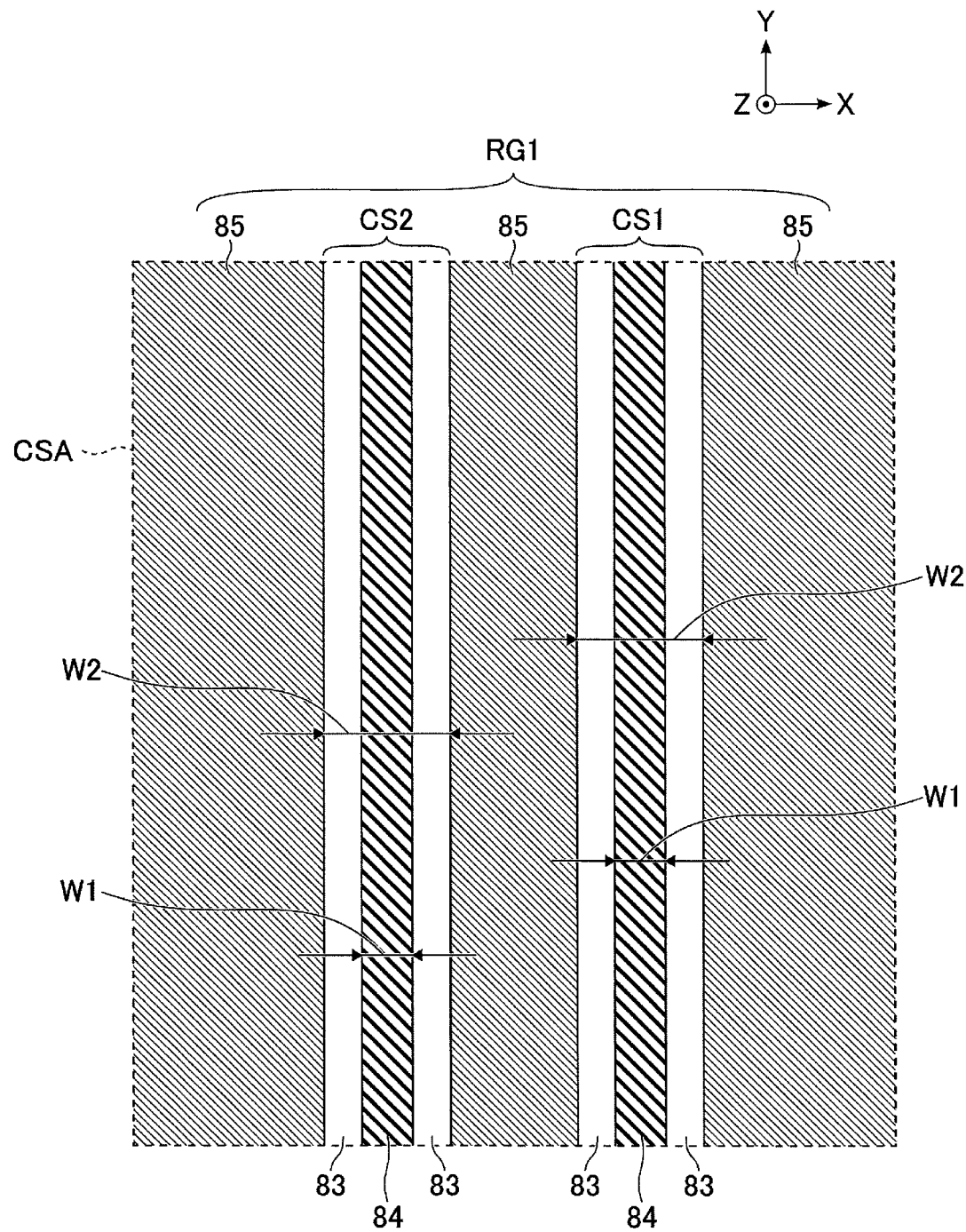
F I G. 20

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2018-043173, filed Mar. 9, 2018, the entire contents of which are incorporated herein by reference.

FIELD

Embodiments described herein relate generally to a semiconductor device and method for manufacturing semiconductor device.

BACKGROUND

NAND-type flash memories having three-dimensionally stacked memory cells are known.

BRIEF DESCRIPTION OF THE DRAWINGS

FIG. 5 is a plan view showing an example of a detailed planar layout of the memory cell array included in the semiconductor device according to the embodiment.

FIG. 6 is a cross-sectional diagram showing an example of a cross-sectional structure in a cell area of the memory cell array included in the semiconductor device according to the embodiment.

FIGS. 9 and 10 are cross-sectional diagrams respectively showing an example of a cross-sectional structure in a crack stopper region of the semiconductor device according to the embodiment.

FIG. 17 is a planar layout diagram showing an example of a process of manufacturing the semiconductor device according to the embodiment.

FIG. 20 is a planar layout view of the crack stopper region showing an example of a process of manufacturing the semiconductor device according to the embodiment.

DETAILED DESCRIPTION

Figure 1:
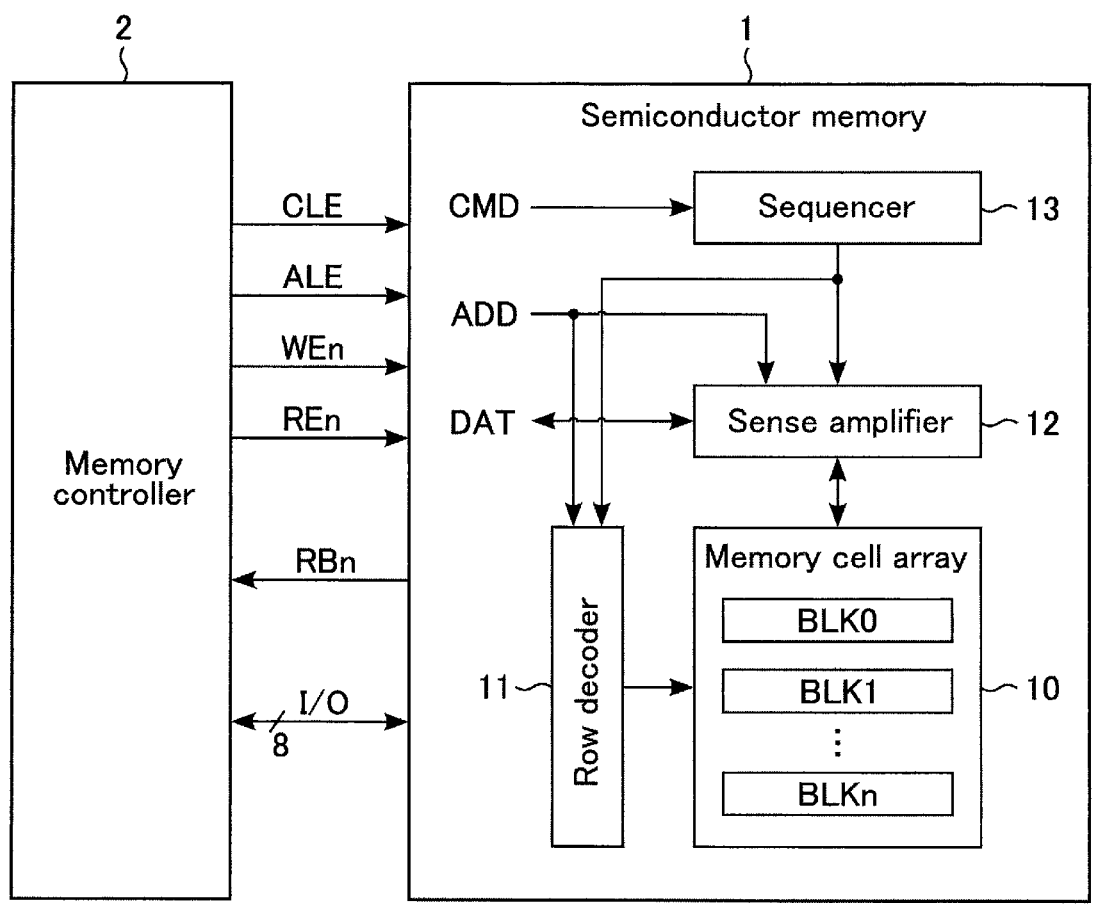
FIG. 1 is a block diagram showing a configuration example of a semiconductor device according to an embodiment.

A semiconductor device according to an embodiment includes a substrate, first to third conductors, and first and second contacts. The substrate includes a core region, and a peripheral area surrounding an outer periphery of the core region. The first conductor is provided in a first layer above the substrate in the core region. The first contact extends in a first direction intersecting with a surface of the substrate, and is provided on the first conductor. The second conductor is provided in the first layer and is insulated from the first conductor in the peripheral area. The third conductor is provided between the second conductor and the substrate. The second contact extends in the first direction through the second conductor, and is provided on the third conductor. A width of the second contact, as viewed in a second direction parallel to the surface of the substrate, differs between a portion above a boundary face that is included in the first layer and is parallel to the surface of the substrate, and a portion that is below the boundary face.

Hereinafter, the embodiment will be described with reference to the accompanying drawings. The embodiment is an example of an apparatus or a method to embody a technical idea of an invention. Note that the drawings are schematic or conceptual, and the dimensions, ratios, etc., in the drawings are not necessarily the same as the actual ones. Also, the technical idea of the present invention is not specified by a shape, structure, arrangement, etc., of constituent elements.

In the description below, constituent elements having substantially the same function and configuration will be denoted by the same reference symbol.

[1] Embodiment

Hereinafter, a semiconductor device 1 according to an embodiment will be described.

[1-1] Configuration

[1-1-1] Overall Configuration of Semiconductor Device 1

FIG. 1 shows a configuration example of the semiconductor device 1 according to the embodiment. The semiconductor device 1 according to the embodiment is a NAND-type flash memory that is controlled by an external memory controller 2 and is capable of storing data in nonvolatile manner.

As shown in FIG. 1, the semiconductor device 1 includes, for example, a memory cell array 10, a row decoder 11, a sense amplifier 12, and a sequencer 13.

The memory cell array 10 includes a plurality of blocks BLK0 to BLKn (n being an integer of 1 or greater). The block BLK is a group of nonvolatile memory cells and is handled as, for example, a unit for data erasure. A plurality of bit lines and a plurality of word lines are provided in the memory cell array 10. Each memory cell is associated with one bit line and one word line. The detailed configuration of the memory cell array 10 will be described later.

The row decoder 11 selects one block BLK based on address information ADD received by the semiconductor device 1 from the memory controller 2. The row decoder 11 then applies desired voltages to, for example, a selected word line and a non-selected word line, respectively.

The sense amplifier 12 holds write data DAT received by the semiconductor device 1 from the memory controller 2 in a write operation, and applies a desired voltage to the bit line based on the write data DAT. The sense amplifier 12 also evaluates data stored in the memory cell based on the voltage of the bit line in a read operation, and outputs, to the memory controller 2, read data DAT that is based on a result of the evaluation.

The sequencer 13 controls the operation of the entire semiconductor device 1 based on a command CMD received by the semiconductor device 1 from the memory controller 2. Communication between the semiconductor device 1 and the memory controller 2 supports, for example, a NAND interface standard. For example, a command latch enable signal CLE, an address latch enable signal ALE, a write enable signal WEn, a read enable signal REn, a ready/busy signal RBn, and an input/output signal I/O are used in the communication between the semiconductor device 1 and the memory controller 2.

The command latch enable signal CLE is a signal indicating that an input/output signal I/O received by the semiconductor device 1 is a command CMD. The address latch enable signal ALE is a signal indicating that a signal I/O received by the semiconductor device 1 is address information ADD. The write enable signal WEn is a signal instructing the semiconductor device 1 to input the input/output signal I/O. The read enable signal REn is a signal instructing the semiconductor device 1 to output the input/output signal I/O. The ready/busy signal RBn is a signal notifying the memory controller 2 of whether the semiconductor device 1 is in a ready state to receive a command from the memory controller 2 or in a busy state not to receive a command from the memory controller 2. The input/output signal I/O is, for example, an 8-bit signal, and may include a command CMD, address information ADD, data DAT, etc.

The semiconductor device 1 and the memory controller 2 as described above may be combined to form a single semiconductor device. Examples of such a semiconductor device include a memory card, such as an SD™ card, and an SSD (solid state drive).

[1-1-2] Circuit Configuration of Memory Cell Array 10

Figure 2:
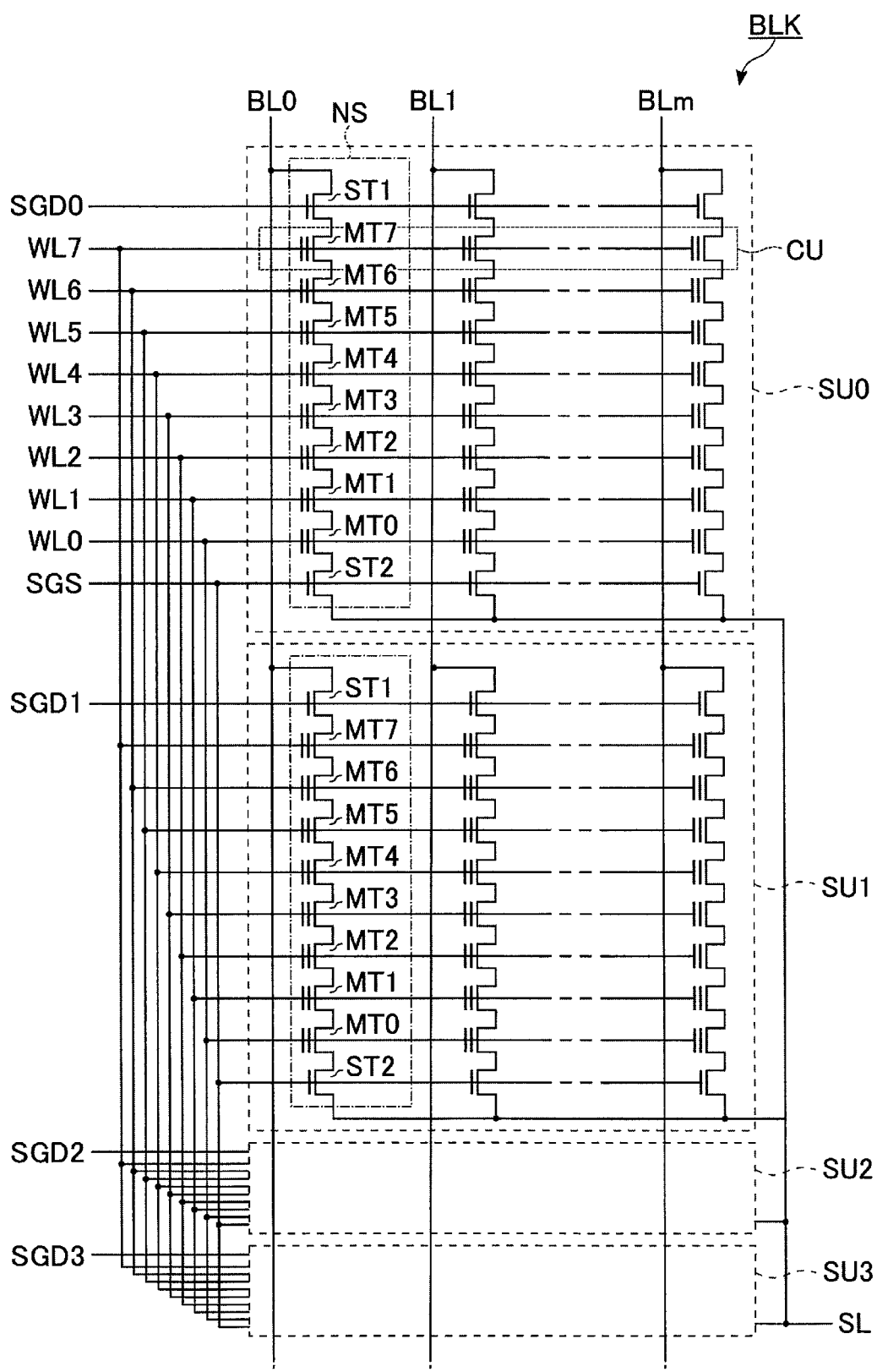
FIG. 2 is a circuit diagram showing an example of a circuit configuration of a memory cell array included in the semiconductor device according to the embodiment.

FIG. 2 illustrates an example of the circuit configuration of the memory cell array 10 included in the semiconductor device 1 according to the embodiment, and shows one block BLK out of the plurality of blocks BLK included in the memory cell array 10.

As shown in FIG. 2, the block BLK includes, for example, four string units SU0 to SU3. Each of the string units SU includes a plurality of NAND strings NS. The plurality of NAND strings NS are respectively associated with bit lines BL0 to BLm (m being an integer of 1 or greater), and each of the NAND strings NS includes, for example, memory cell transistors MT0 to MT7 and selection transistors ST1 and ST2.

Each memory cell transistor MT includes a control gate and a charge storage layer, and stores data in a nonvolatile manner.

Each of the selection transistors ST1 and ST2 is used for selecting a string unit SU and a block BLK in various operations.

In each NAND string NS, the drain of the selection transistor ST1 is coupled to a corresponding bit line BL. The memory cell transistors MT0 to MT7 are coupled in series between the source of the selection transistor ST1 and the drain of the selection transistor ST2. The source of the selection transistor ST2 is coupled to a source line SL.

In the same block BLK, the control gates of the memory cell transistors MT0 to MT7 are coupled in common to word lines WL0 through WL7, respectively. The gates of the selection transistors ST1 included in the respective string units SU0 to SU3 are coupled in common to selection gate lines SGD0 through SGD3, respectively. The gates of the selection transistors ST2 are coupled in common to a selection gate line SGS.

A different column address is allocated to each of the bit lines BL0 to BLm. Each bit line BL commonly couples the drains of the selection transistors ST1 included in the NAND strings NS corresponding to each other between the plurality of blocks BLK. Each of the word lines WL0 to WL7 is provided in each block BLK. The source line SL is shared between the plurality of blocks BLK.

A group of memory cell transistors MT coupled to a common word line WL in one string unit SU is referred to as, for example, a cell unit CU. In the semiconductor device 1, a storage capacity called "one-page data" corresponds to, for example, a storage capacity of the cell unit CU for a case where each of the memory cell transistors MT in the cell unit CU stores one-bit data.

The circuit configuration of the memory cell array 10 is not limited to the configuration described above. For example, the number of string units SU included in each block BLK may be discretionarily set.

The number of memory cell transistors MT and selection transistors ST1 and ST2 included in each NAND string NS may be discretionarily set. The number of word lines WL and selection gate lines SGD and SGS may be varied based on the number of memory cell transistors MT and the number of selection transistors ST1 and ST2.

[1-1-3] Structure of Semiconductor Device 1

(Planar Layout of Entire Semiconductor Device 1)

Figure 3:
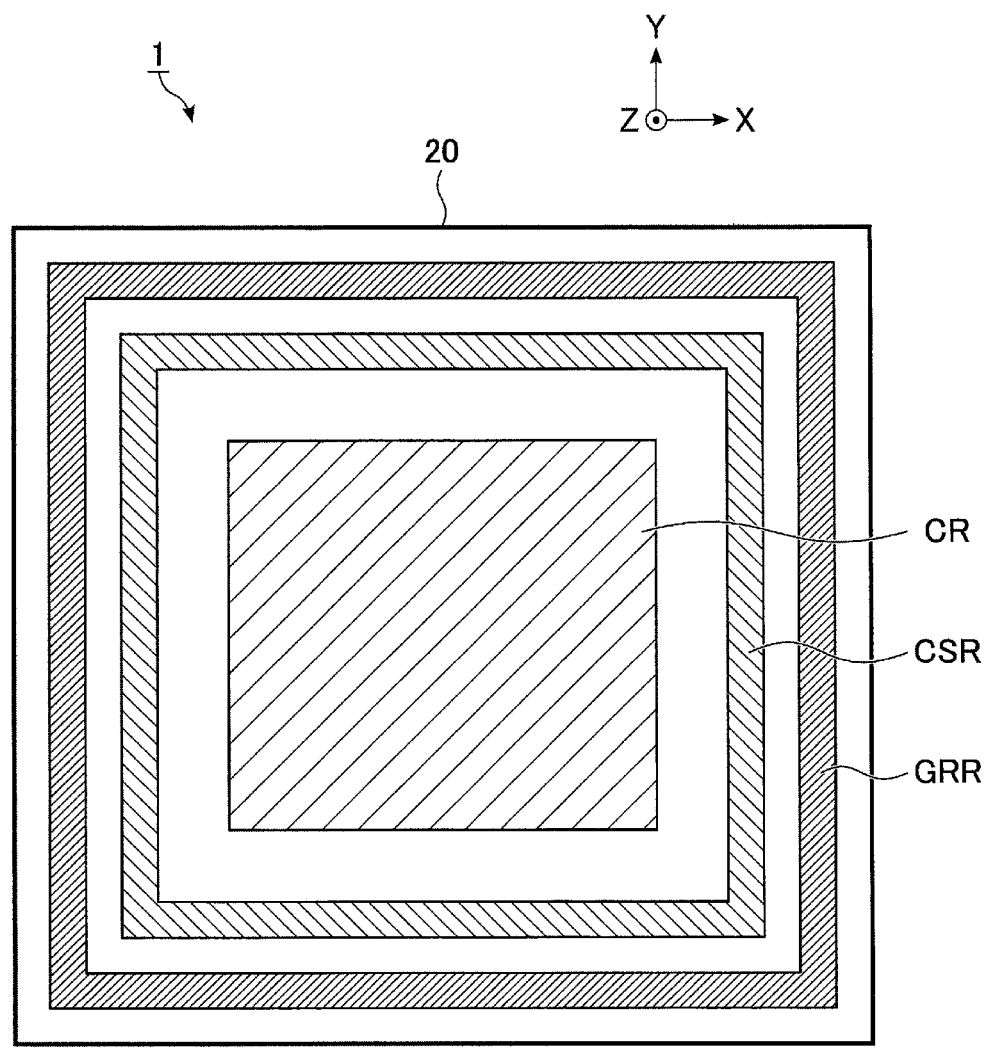
FIG. 3 is a plan view showing an example of a planar layout of the semiconductor device according to the embodiment.

FIG. 3 shows an example of a planar layout of the constituent elements on a semiconductor substrate 20 to form the semiconductor device 1 according to the embodiment. In the drawings that are referred to in the description below, an X-axis corresponds to an extending direction of the word lines WL, a Y-axis corresponds to an extending direction of the bit lines BL, and a Z-axis corresponds to a direction perpendicular to a surface of the semiconductor substrate 20 to form the semiconductor device 1.

As shown in FIG. 3, a region on the semiconductor substrate 20 includes a core region CR, a crack stopper region CSR, and a guard ring region GRR.

The core region CR is a region where the memory cell array 10 is formed. The core region CR is formed in, for example, a rectangular shape, and is provided in a central part of the semiconductor substrate 20. The core region CR is not limited thereto, and may be arranged in any region. If the semiconductor device 1 includes a plurality of memory cell arrays 10, a plurality of core regions CRs may be provided on the semiconductor substrate 20.

The crack stopper region CSR is formed in, for example, a quadrilateral-ring shape, and is provided so as to surround an outer periphery of the core region CR. If a plurality of core regions CRs are provided on the semiconductor substrate 20, the crack stopper region CSR may be provided so as to surround the plurality of core regions CRs, or a plurality of crack stopper regions CSRs may be provided so as to respectively surround the plurality of core regions CRs.

In this specification, the "quadrilateral-ring shape" only needs to be a ring shape that includes a portion where constituent elements concerned extend at least in directions intersecting with each other. Thus, the "quadrilateral-ring shape" may include an oblique corner and a non-linear side. Also, in this specification, the "ring shape" is not limited to a circular shape, but includes a quadrilateral-ring shape.

A crack stopper CS, which will be described later, is formed in the crack stopper region CSR. When a crack or peeling of an interlayer insulator film, etc., occurs at an end of the semiconductor device 1 in a dicing process for example, the crack stopper CS suppresses the crack or peeling from reaching an inner side of the semiconductor device 1 (e.g., core region CR). The crack stopper CS also suppresses moisture, etc., from permeating into the core region CR from the end of the semiconductor device 1.

Moreover, the crack stopper CS suppresses a surge from entering from the outside in a dicing process or a packaging process, and suppresses generation of overcurrent of a guard ring in an interconnect layer. The crack stopper CS is used to couple an interconnect provided in an upper layer of the semiconductor device 1 to an N-type well region or a P-type well region on the semiconductor substrate 20. In addition, the crack stopper CS suppresses stress generated in the interlayer insulator film (e.g, tetraethoxysilane (TEOS)) of the semiconductor device 1.

The guard ring region GRR is formed in, for example, a quadrilateral-ring shape, and is provided so as to surround an outer periphery of the crack stopper region CSR. A guard ring is formed in the guard ring region GRR. The guard ring fixes an outer periphery of the semiconductor device 1 to the same potential (for example, ground potential VSS) in order to stabilize the potential of a power wire, well, etc. Also, the guard ring suppresses an impurity having an electric charge, etc., from entering, for example, from silicon exposed to the end of the semiconductor device 1.

Peripheral circuits, such as the row decoder 11 and the sense amplifier 12, are formed in a region surrounded by the crack stopper region CSR. These peripheral circuits may be formed in the core region CR. In this case, the peripheral circuits are provided between the semiconductor substrate 20 and the memory cell array 10, namely, below the memory cell array 10. The row decoder 11 among the peripheral circuits is electrically coupled to various interconnects (e.g., word line WL) provided in the memory cell array 10 via, for example, a region between the core region CR and the crack stopper region CSR.

In the semiconductor device 1 according to the embodiment, the arrangement of the crack stopper region CSR and the arrangement of the guard ring region GRR may be switched. In the semiconductor device 1 according to the embodiment, a region where the crack stopper region CSR and the guard ring region GRR are provided is also referred to as an edge seal portion or a peripheral region of the semiconductor device 1.

(Structure of Memory Cell Array 10)

Figure 4:
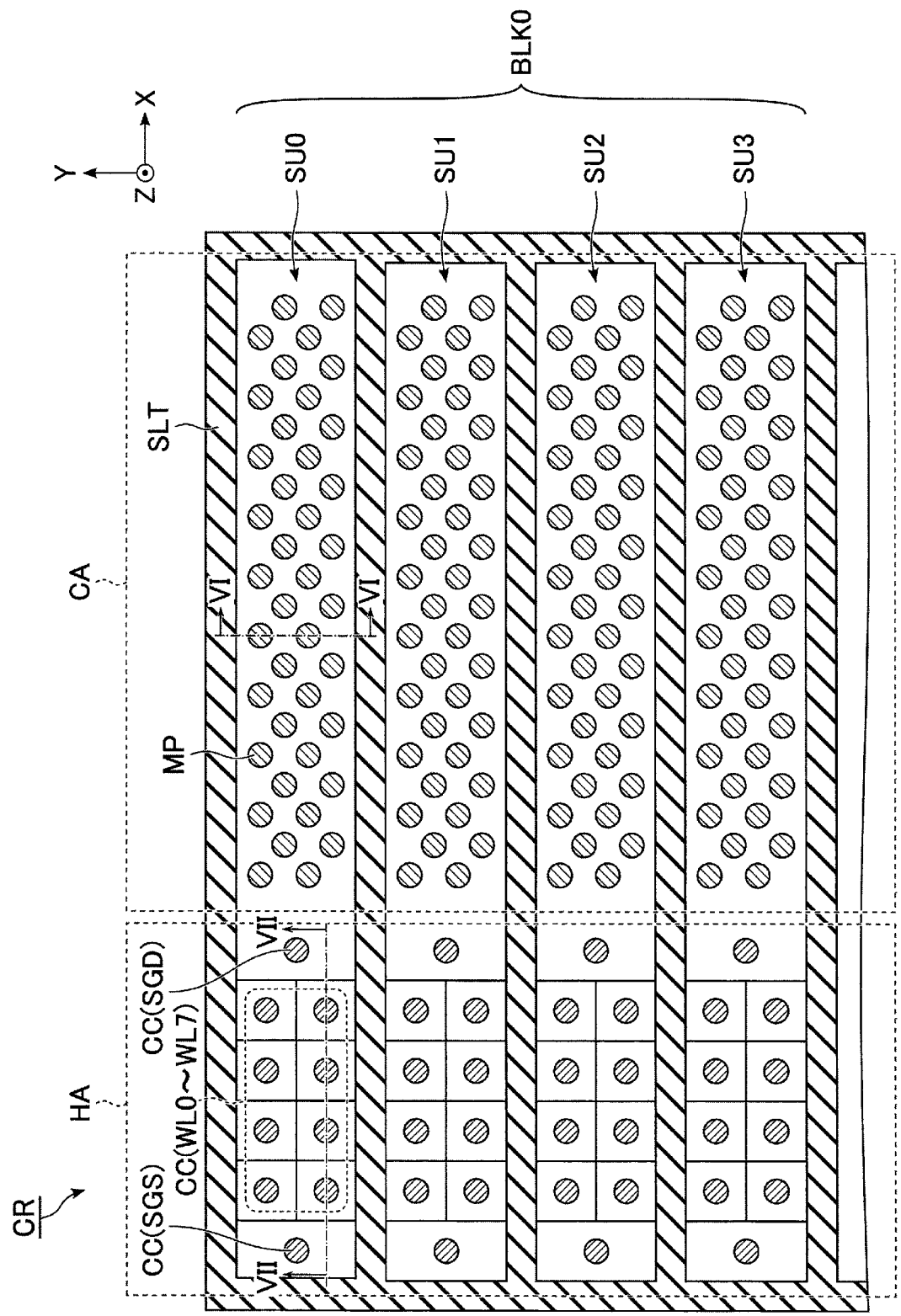
FIG. 4 is a plan view showing an example of a planar layout of the memory cell array included in the semiconductor device according to the embodiment.

FIG. 4 illustrates an example of a planar layout of the memory cell array 10 in the embodiment, and shows a structure corresponding to the block BLK0 out of the plurality of blocks BLK that are arranged in the Y-direction in the core region CR.

As shown in FIG. 4, structures corresponding to the respective string units SU0 to SU3 of the block BLK0 are, for example, each provided to extend in the X-direction, and are arranged in the Y-direction. Also, the structures corresponding to the respective string units SU0 to SU3 are, for example, each surrounded by a slit SLT. Namely, a slit SLT extending in the X-direction is provided between the string units SU that are adjacent to each other in the Y-direction.

In other words, a plurality of slits SLT extending in the X-direction are arranged in the Y-direction. Two slits SLT extending in the Y-direction are provided so as to connect one end part and the other end part, as viewed in the X-direction, of each of the plurality of slits SLT extending in the X-direction. The structure surrounded by the two slits SLT extending in the Y-direction and the slits SLT adjacent to each other in the Y-direction corresponds to one string unit SU. A plurality of string units SU may be provided in each region surrounded by the slits SLT.

In the core region CR, the area where the structures corresponding to the string units SU are provided is further divided into a cell area CA and a hookup area HA. First, a detailed structure of the string units SU in the cell area CA will be described.

The cell area CA is, in effect, an area where data is held. A plurality of memory pillars MP are provided in the cell area CA in, for example, a staggered pattern. Each of the memory pillars MP functions as, for example, one NAND string NS. The number of memory pillars MP shown in FIG. 4 is a typical example. The number of memory pillars MP is not limited to the one shown in the drawing.

FIG. 5 shows an example of a detailed planar layout of the memory cell array 10 in the cell area CA in the embodiment.

Each of the plurality of bit lines BL, for example, extends in the Y-direction and is arranged in the X-direction, as shown in FIG. 5. Each of the plurality of bit lines BL is coupled to one memory pillar MP for each string unit SU.

Specifically, two bit lines BL, for example, overlap each of the memory pillars MP in each string unit SU. Also, one bit line BL out of the two bit lines BL that overlap each of the memory pillars MP is coupled to a corresponding memory pillar MP via a columnar contact VY.

FIG. 6 shows an example of a cross-sectional structure of the memory cell array 10 taken along the VI-VI line of FIG. 4. In the cross-sectional diagrams that are referred to in the description below, constituent elements such as an interlayer insulator film, an interconnect, and a contact are omitted as appropriate to make it easy to refer to the diagrams.

As shown in FIG. 6, the semiconductor device 1 includes, for example, the semiconductor substrate 20, conductors 22, 23, 25, 27, 30 to 41, 47, and 48, columnar contacts 21, 24, 26, 46, and VY, and the memory pillars MP in the cell area CA.

For example, the contact 21 is provided on the semiconductor substrate 20. The contact 21 is coupled to an impurity diffusion region (not shown in the drawings) that is provided to the semiconductor substrate 20. The conductor 22 is provided on the contact 21. For example, the conductor 23 is provided between the contacts 21 adjacent to each other. The conductor 23 functions as, for example, a gate electrode of a transistor TR formed on the semiconductor substrate 20.

For example, the contact 24 is provided on the conductor 22, the conductor 25 is provided on the contact 24, the contact 26 is provided on the conductor 25, and the conductor 27 is provided on the contact 26.

The conductor 30 is provided above a layer provided with the conductor 27, via an interlayer insulator film. The conductor 30 is formed in a shape of a plate parallel to the X-Y plane, and corresponds to, for example, the source line SL. A plurality of slits SLT that are provided in parallel with the X-Z plane are arranged on the conductor 30 in the Y-direction. A structure on the conductor 30 and between adjacent slits SLT corresponds to, for example, one string unit SU.

For example, the conductors 31 to 40 are provided on the conductor 30 and between adjacent slits SLT, in the mentioned order from the semiconductor substrate 20 side. Among these conductors, the conductors that are adjacent to each other in the Z-direction are stacked via an interlayer insulator film. Each of the conductors 31 to 40 is formed in a shape of a plate parallel to the X-Y plane.

For example, the conductor 31 corresponds to the selection gate line SGS, the conductors 32 to 39 respectively correspond to the word lines WL0 to WL7, and the conductor 40 corresponds to the selection gate line SGD. The conductor 31 is also used as an etching stopper in a process of manufacturing the semiconductor device 1. For example, polysilicon is used as the conductor 31.

Each memory pillar MP is provided in a shape of a pillar penetrating (passing through) each of the conductors 31 to 40, and is in contact with the conductor 30. Also, the memory pillar MP includes, for example, a block insulator film 42, an insulator film 43, a tunnel oxide film 44, and a semiconductor member 45.

The block insulator film 42 is provided on an inner wall of a columnar memory hole MH formed in a process of manufacturing the semiconductor device 1. In other words, the block insulator film 42 is provided in a cylindrical shape. The insulator film 43 is provided on an inner wall of the block insulator film 42. The insulator film 43 functions as a charge storage layer of the memory cell transistors MT.

The tunnel oxide film 44 is provided on an inner wall of the insulator film 43. The semiconductor member 45, which is conductive, is provided on an inner wall of the tunnel oxide film 44. The semiconductor member 45 functions as a current path of the NAND strings NS. A different material may also be formed on an inner wall of the semiconductor member 45.

A portion in which the above-described memory pillar MP and conductor 31 intersect functions as the selection transistor ST2. Portions in which the memory pillar MP and the conductors 32 to 39 intersect function as the memory cell transistors MT0 to MT7, respectively. A portion in which the memory pillar MP and the conductor 40 intersect functions as the selection transistor ST1.

The conductor 41 is provided above an upper face of the memory pillar MP via an interlayer insulator film. The conductor 41 is formed in a shape of a line extending in the Y-direction, and corresponds to the bit line BL. A plurality of conductors 41 are arranged in the X-direction in a manner similar to the bit lines BL shown in FIG. 5.

The conductor 41 is electrically coupled to one corresponding memory pillar MP in each string unit SU. Specifically, in each string unit SU, the columnar contact VY is provided on the semiconductor member 45 in each memory pillar MP, the columnar contact 46 is provided on the contact VY, and one conductor 41 is provided on the contact 46, for example.

The conductor 47 is provided above a layer provided with the conductor 41, via an interlayer insulator film. The conductor 48 is provided above a layer provided with the conductor 47, via an interlayer insulator film. The conductors 47 and 48 correspond to, for example, interconnects for coupling the interconnects provided in the memory cell array 10 and the peripheral circuits provided below the memory cell array 10. The conductor 47 and the conductor 48 may be coupled with each other by the columnar contact.

In the description below, a layer provided with the conductor 22 is referred to as an interconnect layer D0, a layer provided with the conductor 25 is referred to as an interconnect layer D1, and a layer provided with the conductor 27 is referred to as an interconnect layer D2. A layer provided with the conductor 31 is referred to as an interconnect layer PS. A layer provided with the conductor 41 is referred to as an interconnect layer M0, a layer provided with the conductor 47 is referred to as an interconnect layer M1, and a layer provided with the conductor 48 is referred to as an interconnect layer M2.

Also, a contact that couples the surface of the semiconductor substrate 20 and the conductor provided to the interconnect layer D0 is referred to as a contact C0, a contact that couples the conductor provided to the interconnect layer D0 and the conductor provided to the interconnect layer D1 is referred to as a contact C1, and a contact that couples the conductor provided to the interconnect layer D1 and the conductor provided to the interconnect layer D2 is referred to as a contact C2.

In the structure of the memory cell array 10 described above, a circuit formed by the transistor TR formed on the semiconductor substrate 20, the conductors formed in the interconnect layers D0 to D2, and the contacts C0 to C2 corresponds to the peripheral circuit of the semiconductor device 1.

Returning to FIG. 4, a detailed structure of the string units SU in the hookup area HA will be described. The hookup area HA is an area for electrically coupling the row decoder 11 and various interconnects coupled to the NAND strings NS provided in the cell area CA.

In the hookup area HA, each of a plurality of conductors corresponding to the selection gate line SGS, the word lines WL0 to WL7, and the selection gate line SGD, respectively, includes a portion that does not overlap with conductors located there above. For example, the ends of the plurality of conductors corresponding to various interconnects are provided in a staircase manner. Also, in the example shown in FIG. 4, the ends of the conductors corresponding to the word lines WL are provided to form a stair with two rows.

For example, columnar contacts CC are provided in the hookup area HA so as to correspond to the selection gate line SGS, the word lines WL0 to WL7, and the selection gate line SGD, respectively. Each of the selection gate line SGS, word lines WL0 to WL7, and selection gate line SGD is electrically coupled to the row decoder 11 via the corresponding contact CC.

Figure 7:
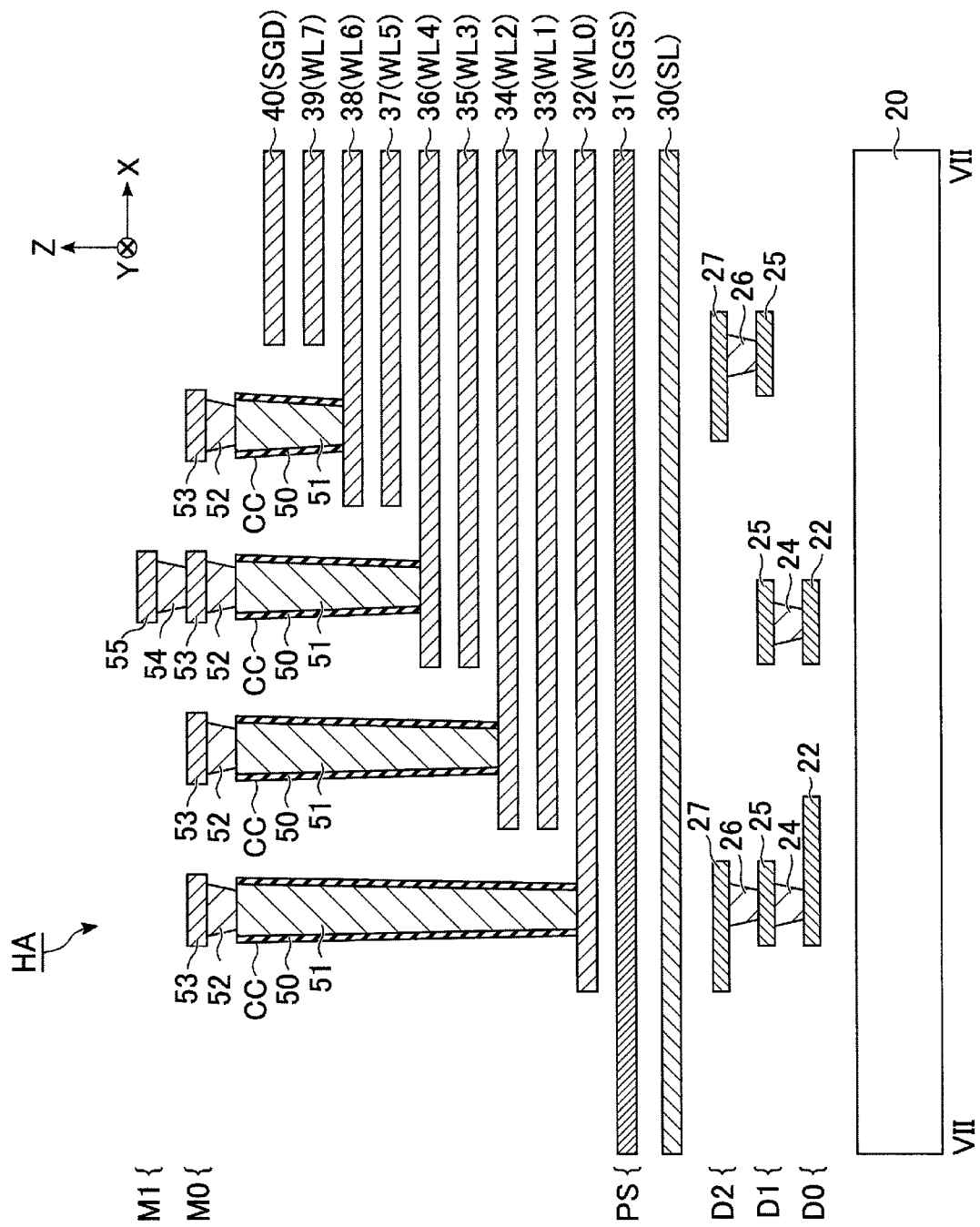
FIG. 7 is a cross-sectional diagram showing an example of a cross-sectional structure in a hookup area of the memory cell array included in the semiconductor device according to the embodiment.

FIG. 7 shows an example of a cross-sectional structure of the memory cell array 10 taken along the VII-VII line of FIG. 4. Since a peripheral circuit is formed between the semiconductor substrate 20 and the conductor 30 in a manner similar to the cell area CA, description of the portion between the semiconductor substrate 20 and the conductor 30 is omitted.

As shown in FIG. 7, the semiconductor device 1 includes, for example, the semiconductor substrate 20, ends of the conductors 30 to 40, conductors 53 and 55, and columnar contacts CC, 52, and 54 in the hookup area HA.

The conductor 53 is an interconnect for coupling the row decoder 11 and various interconnects drawn from the cell area CA to the hookup area HA. A plurality of conductors 53 are provided so as to correspond to the conductors 31 to 40, respectively. FIG. 7 shows the contacts CC and 52 located between the respective ends of the conductors 32, 34, 36, and 38 and the corresponding conductors 53.

Specifically, the contact CC is provided, for example, on the end of the conductor 32 as viewed in the X-direction. The contact CC includes a spacer 50 and a conductor 51. The spacer 50 is provided on an inner wall of a columnar contact hole CH formed in a process of manufacturing the semiconductor device 1. The conductor 51 is provided on an inner wall of the spacer 50.

Namely, the contact CC includes the conductor 51 having a column shape, and a lateral face of the conductor 51 is covered with the spacer 50. For example, an insulator of silicon oxide SiO2, silicon nitride SiN, or the like is used as the spacer 50. Tungsten (W), for example, is used as the conductor 51.

Also, the contact 52 is provided between the corresponding conductor 51 and conductor 53; and the conductor 32 and the corresponding conductor 53, for example, are electrically coupled to each other. Likewise, the contact CC is provided between each end of the conductors 31, and 33 to 40, and the corresponding conductor 53, including an area not shown in the drawings.

In FIG. 7, the columnar contact 54 is provided, for example, on the conductor 53 corresponding to the conductor 36. The conductor 55 is provided on the contact 54. Likewise, the contact 54 is provided between the corresponding conductor 53 and conductor 55 in an area not shown in the drawings. In an area not shown in the drawings, various interconnects are electrically coupled to the row decoder 11 provided below the memory cell array 10.

Figure 8:
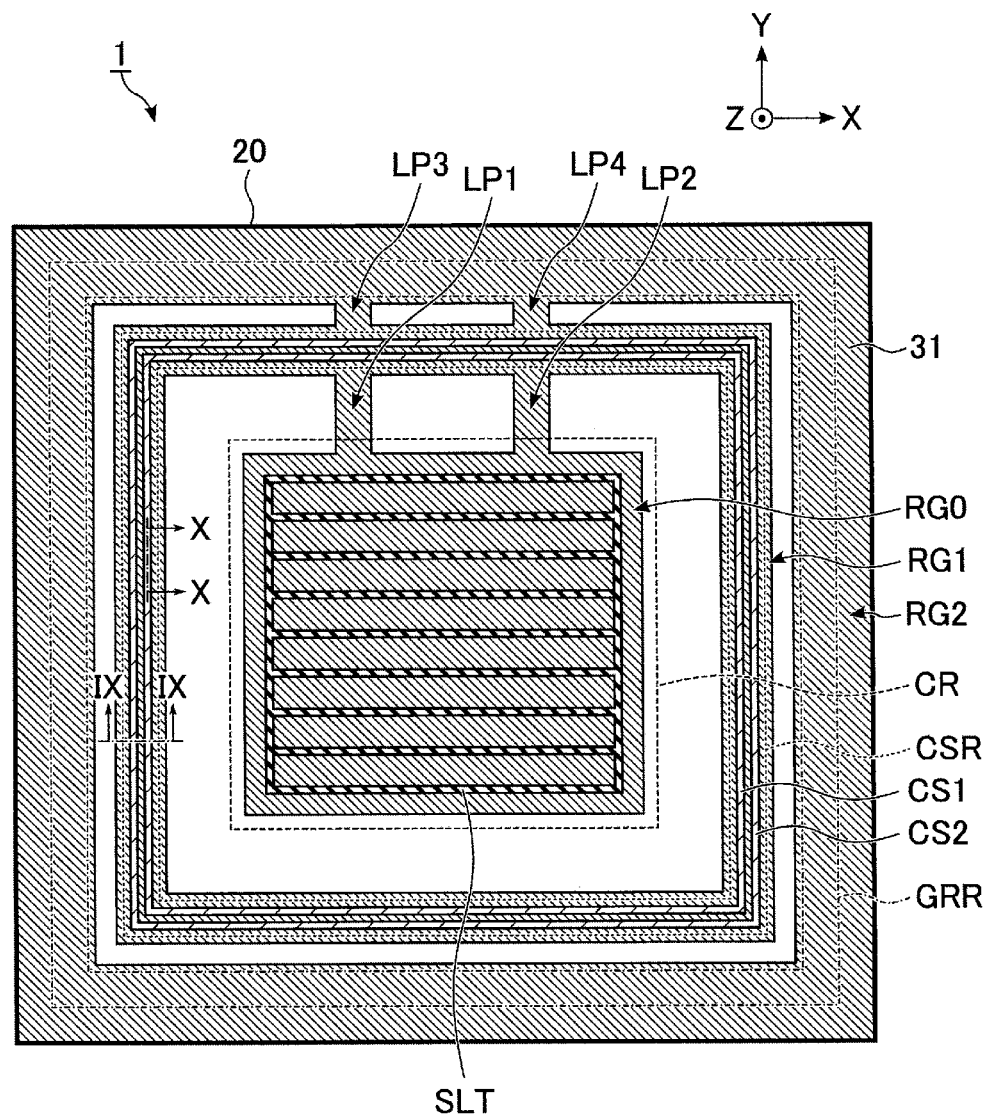
FIG. 8 is a plan view showing an example of a region where an etching stopper is formed, a region where a slit is formed, and a region where a crack stopper is formed, in the planar layout of the semiconductor device according to the embodiment.

An example of a planar layout of the conductor 31 and the slits SLT in the interconnect layer PS of the semiconductor device 1 described above will be described with reference to FIG. 8. FIG. 8 shows an example of a region where an etching stopper (conductor 31) is formed and a region where the slits SLT are formed, in the planar layout of the semiconductor device 1 according to the embodiment.

As shown in FIG. 8, The region where the conductor 31 is formed is divided into, for example, regions RG0 to RG2 and LP1 to LP4.

For example, the region RG0 is a rectangular region provided so as to correspond to the core region CR. The slits SLT described with reference to FIG. 4 are provided in the region RG0. The region RG1 is a region having a quadrilateral-ring shape and provided so as to surround an outer periphery of the region RG0. For example, the crack stopper region CSR is included in the region RG1. The region RG2 is a region having a quadrilateral-ring shape and provided so as to surround an outer periphery of the region RG1. For example, the guard ring region GRR is included in the region RG2.

Each of the regions LP1 to LP4 is a linear region. Each of the regions LP1 and LP2 connects the regions RG0 and RG1. Each of the regions LP3 and LP4 connects the regions RG1 and RG2. It is sufficient as long as at least one region LP that connects the regions RG0 and RG1 and at least one region LP that connects the regions RG1 and RG2 are provided.

The conductor 31 surrounded with the slits SLT is insulated from the conductor 31 provided in other regions (e.g., regions RG1 and RG2). The conductor 31 provided in other regions is, for example, grounded. Namely, the potential of the conductor 31 provided in the region RG1, for example, is fixed to a ground voltage.

In the hookup area HA in the core region CR, various interconnects drawn from the cell area CA are electrically coupled to the row decoder 11 provided on the semiconductor substrate 20, via a region between the regions RG0 and RG1 of the conductor 31.

In the structure of the memory cell array 10 described above, a plurality of conductors 31 provided to a plurality of layers may be allocated to the selection gate line SGS, and a different material may be used for each of the conductors 31 provided to the plurality of layers. A plurality of conductors 40 provided to a plurality of layers may be allocated to the selection gate line SGD. The number of conductors provided between the conductor 31 and the conductor 40 is set based on the number of word lines WL. At least one additional conductor may be provided as a dummy word line between the conductor 31 and the conductor 40.

One NAND string NS may have a structure in which a plurality of memory pillars MP are coupled in the Z-direction. The memory pillars MP and the conductor 41 may be electrically coupled to each other via one contact or three or more contacts. In the case of using a plurality of contacts, the contacts may be electrically coupled via another interconnect.

The number of interconnect layers forming a peripheral circuit is not limited to the three interconnect layers D0 to D2, and may be discretionarily set. The number of interconnect layers provided above the interconnect layer M0 provided with the bit line BL is not limited to the two interconnect layers M1 and M2, and may be discretionarily set.

(Structure of Semiconductor Device 1 in Crack Stopper Region CSR)

Next, a detailed structure of the semiconductor device 1 in the crack stopper region CSR will be described with reference to FIG. 8.

As shown in FIG. 8, for example, two crack stoppers CS1 and CS2 are provided in the crack stopper region CSR. Each of the crack stoppers CS1 and CS2 is formed in, for example, a quadrilateral-ring shape. An outer periphery of the crack stopper CS1 is surrounded by the crack stopper CS2. In the example shown in FIG. 8, each crack stopper CS surrounds an outer periphery of the core region CR; however, each crack stopper CS may be separated into multiple portions.

Figure 10:
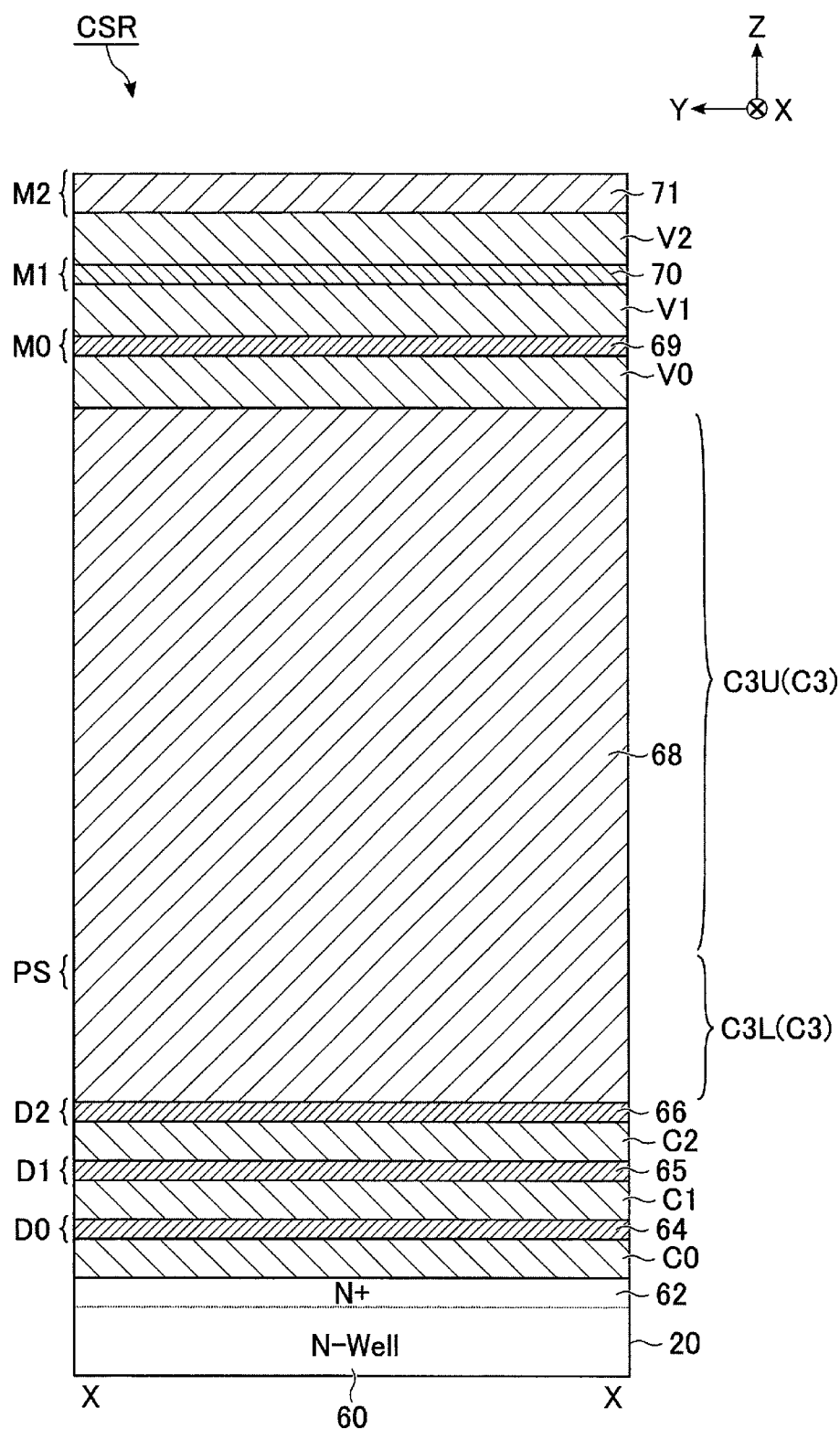

FIG. 9 shows an example of a cross-sectional structure of the semiconductor device 1 in the crack stopper region CSR taken along the IX-IX line of FIG. 8. FIG. 10 shows an example of a cross-sectional structure of the semiconductor device 1 in the crack stopper region CSR taken along the X-X line of FIG. 8. A detailed structure of the crack stopper CS will be described below with reference to FIGS. 9 and 10.

In the crack stopper region CSR, an N-type well region 60 and a P-type well region 61, for example, are formed within the surface of the semiconductor substrate 20. For example, the N-type well region 60 and the P-type well region 61 are provided so as to correspond to the crack stoppers CS1 and CS2, respectively.

For example, an $N^+$ impurity diffusion region 62 is formed in a region in the N-type well region 60 including the surface of the semiconductor substrate 20. A $P^+$ impurity diffusion region 63 is formed in a region in the P-type well region 61 including the surface of the semiconductor substrate 20. An insulation region STI is formed in a region between the $N^+$ impurity diffusion region 62 and the $P^+$ impurity diffusion region 63.

Each crack stopper CS includes conductors 64 to 66 and 69 to 71, and contacts C0 to C3 and V0 to V2.

The contact C0 extends in the Y-direction, and is provided on the N+ impurity diffusion region 62 and the P+ impurity diffusion region 63. Since the other structures of the crack stoppers CS1 and CS2 are the same, only the crack stopper CS1 will be described below.

The conductor 64 extending in the Y-direction is provided on the contact C0. The contact C1 extending in the Y-direction is provided on the conductor 64. The conductor 65 extending in the Y-direction is provided on the contact C1. The contact C2 extending in the Y-direction is provided on the conductor 65. The conductor 66 extending in the Y-direction is provided on the contact C2. The conductors 64 to 66 are provided to the interconnect layers D0 to D2, respectively.

The contact C3 having a plate shape and parallel to the Y-Z plane is provided on the conductor 66. The contact C3 includes two portions (C3L and C3U) with the interconnect layer PS disposed as a boundary between them. In the description below, a portion of the contact C3 corresponding to a lower layer is referred to as a contact C3L, and a portion of the contact C3 corresponding to an upper layer is referred to as a contact C3U.

The contact C3 includes a spacer 67 and a conductor 68. The spacer 67 is provided on a sidewall of a contact slit CL formed in a process of manufacturing the semiconductor device 1. Specifically, a spacer 67L is provided to a sidewall portion of the contact C3L, and a spacer 67U is provided to a sidewall portion of the contact C3U. The spacers 67L and 67U are separated from each other, and a region including a part between the spacers 67L and 67U corresponds to a boundary part BP between the contacts C3L and C3U. For example, an insulator of silicon oxide SiO2, silicon nitride SiN, or the like is used as the spacer 67.

In the contact C3, the conductor 68 is provided closer to the inner side than the spacers 67L and 67U. The conductor 68 is in contact with the conductor 31 at the boundary part BP, and is in contact with the conductor 66 at a bottom portion of the contact C3. Namely, the conductor 68 is electrically coupled to the conductors 31 and 66 that the conductor 68 is in contact with. For example, tungsten (W) is used as the conductor 68.

For example, a dimension L1 of the uppermost part of the contact C3U as viewed in the X-direction is larger than a dimension L2 of a portion of the contact C3U at the boundary part BP as viewed in the X-direction. A dimension L3 of a portion of the contact C3L at the boundary part BP as viewed in the X-direction is smaller than the dimension L2. As shown in FIG. 9, a width of the plate-shaped contact C3 as viewed in the X-direction non-sequentially varies to a great degree, for example, between a portion above the boundary part BP included in the interconnect layer PS, and a portion below the boundary part BP. Also, an angle of a tapered portion TPU of the contact C3U may differ from an angle of a tapered portion TPL of the contact C3L.

In FIG. 9, the width of the contact C3 as viewed in the X-direction is indicated by the space between the outer portions of the spacer 67 that are opposed to each other in the X-direction. However, the width of the contact C3 as viewed in the X-direction may be defined by the space between the inner portions of the spacer 67 that are opposed to each other in the X-direction, namely, the width of the conductor 68 as viewed in the X-direction. In this case as well, the relationship between the width of the contact C3U and the width of the contact C3L at the boundary part BP is the same as described above.

The contact V0 extending in the Y-direction is provided on the conductor 68. The conductor 69 extending in the Y-direction is provided on the contact V0. The contact V1 extending in the Y-direction is provided on the conductor 69. The conductor 70 extending in the Y-direction is provided on the contact V1. The contact V2 extending in the Y-direction is provided on the conductor 70. The conductor 71 extending in the Y-direction is provided on the contact V2. The conductors 69 to 71 are provided to the interconnect layers M0 to M2, respectively.

The crack stopper CS as described above is formed to surround the core region CR. Namely, in the crack stopper region CSR having a quadrilateral-ring shape, the crack stopper CS having a quadrilateral-ring shape is provided to extend from a portion above the semiconductor substrate 20 to the interconnect layer M2. A cross section of the contact C3 taken along a face parallel to the surface of the semiconductor substrate 20 is formed in a quadrilateral-ring shape. In the crack stopper region CSR, each of the contact C3, conductor 31, and conductor 66 surrounds the core region CR.

The case in which the crack stopper CS corresponding to the N-type well region 60 and the crack stopper CS corresponding to the P-type well region 61 are provided in the semiconductor device 1 according to the embodiment, has been described as an example. However, the semiconductor device 1 is not limited thereto. It is sufficient as long as at least one crack stopper CS is provided in the crack stopper region CSR of the semiconductor device 1. Three or more crack stoppers CS may be provided.

For example, if two or more crack stoppers CS corresponding to the N-type well region 60 or the P-type well region 61 are provided, the conductors 71 respectively provided to different crack stoppers CS coupled to the same type of well may be integrally formed. Metal materials, such as titanium, titanium nitride, and tungsten, are used as materials of the conductors and the contacts included in the crack stopper CS. The materials for the crack stopper CS are not limited thereto, and any metal material may be used.

[1-2] Method of Manufacturing Semiconductor Device 1

Next, a manufacturing process from stacking of an insulator/replacement member for forming the word lines WL, etc., to formation of the contact C3 will be described with reference to FIGS. 11 to 24.

FIGS. 11 to 24 respectively show an example of a process of manufacturing the semiconductor device 1 according to the embodiment, and show the cross-sectional structure or planar layout of each of the cell area CA, hookup area HA, and crack stopper region CSR in each manufacturing process.

Figure 11:
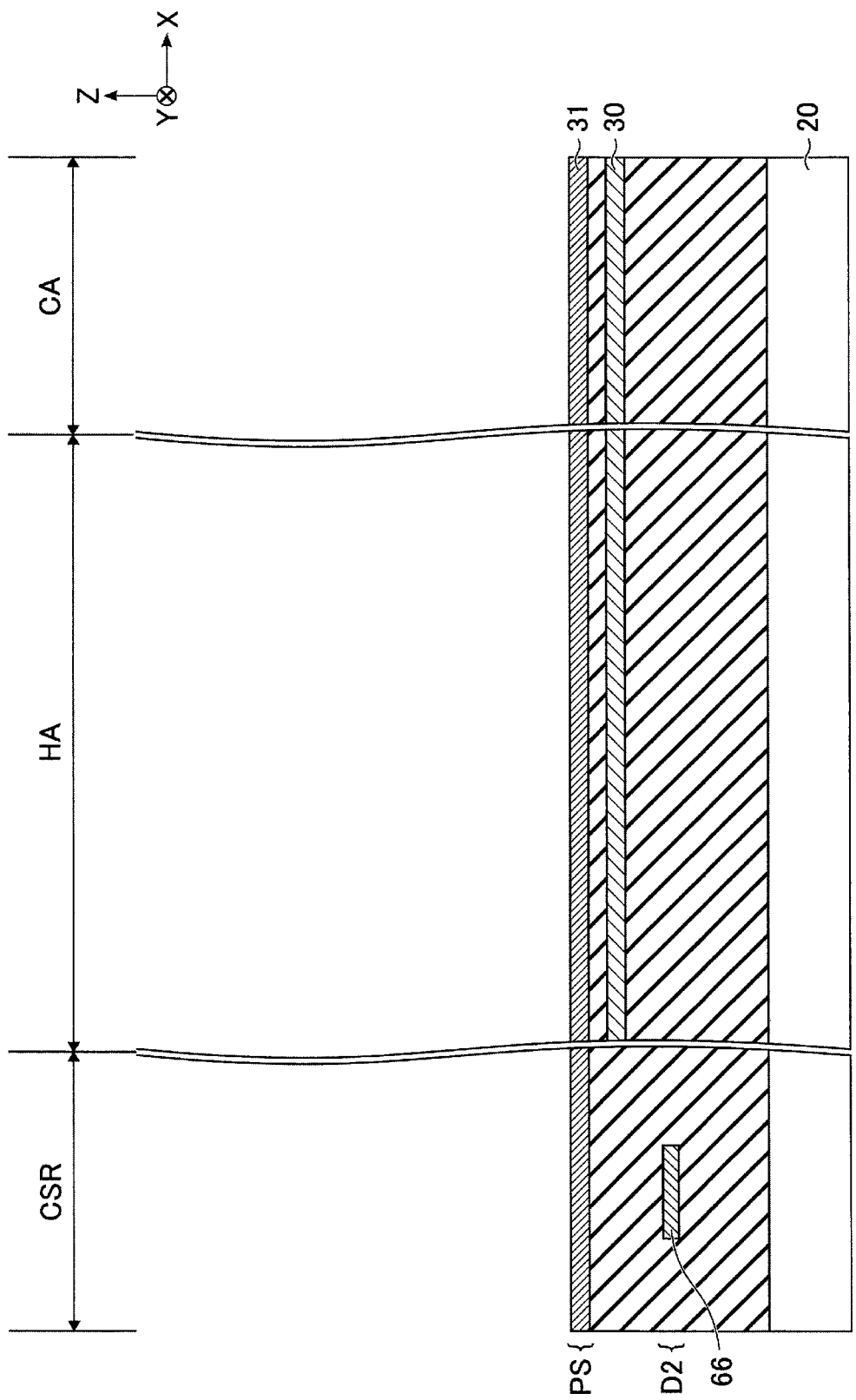
FIGS. 11, 12, 13, 14, 15, and 16 are cross-sectional views of the cell area, hookup area, and crack stopper region respectively showing an example of a process of manufacturing the semiconductor device according to the embodiment.

Specifically, the conductor 31 is formed on the semiconductor substrate 20 via the insulator, as shown in FIG. 11, and the conductor 31 is patterned in such a shape as shown in FIG. 8. A control circuit, etc., of the semiconductor device 1 is formed between the semiconductor substrate 20 and the interconnect layer PS where the conductor 31 is formed; and the conductor 66 corresponding to one crack stopper CS formed in the interconnect layer D2, and the conductor 30 formed in the cell area CA and the hookup area HA are shown in FIG. 11.

Figure 12:
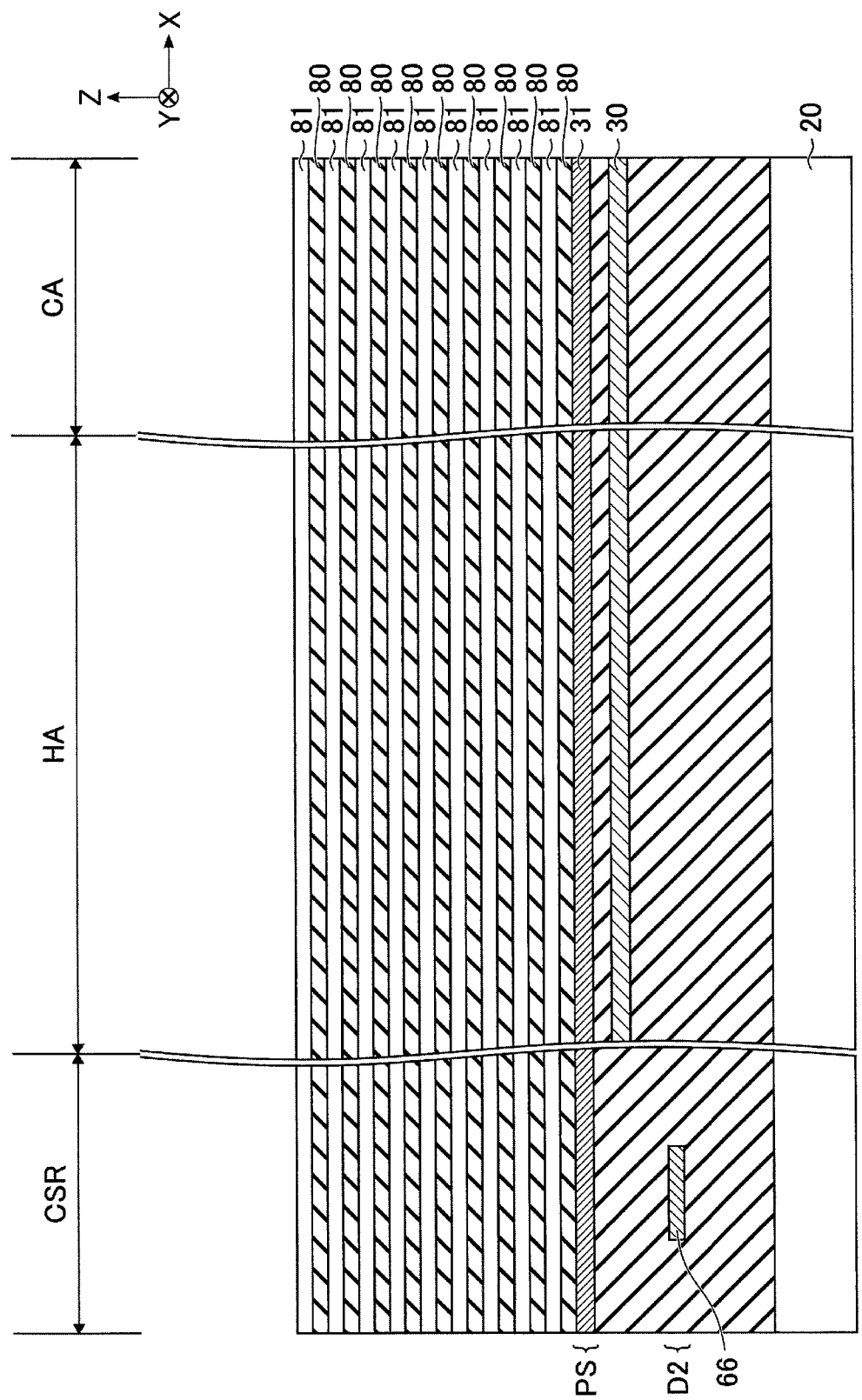

Also, an insulator film 80 and a replacement member 81 are alternately stacked on the conductor 31, as shown in FIG. 12. For example, an oxide film of silicon oxide SiO2, etc., is used as the insulator film 80, and a nitride film of silicon nitride SiN, etc., is used as the replacement member 81. The number of layers where the replacement member 81 is formed corresponds to, for example, the number of word lines WL and selection gate lines SGD corresponding to the NAND strings NS. The respective replacement members 81 correspond to the word lines WL0 to WL7 and the selection gate line SGD in ascending order.

Figure 13:
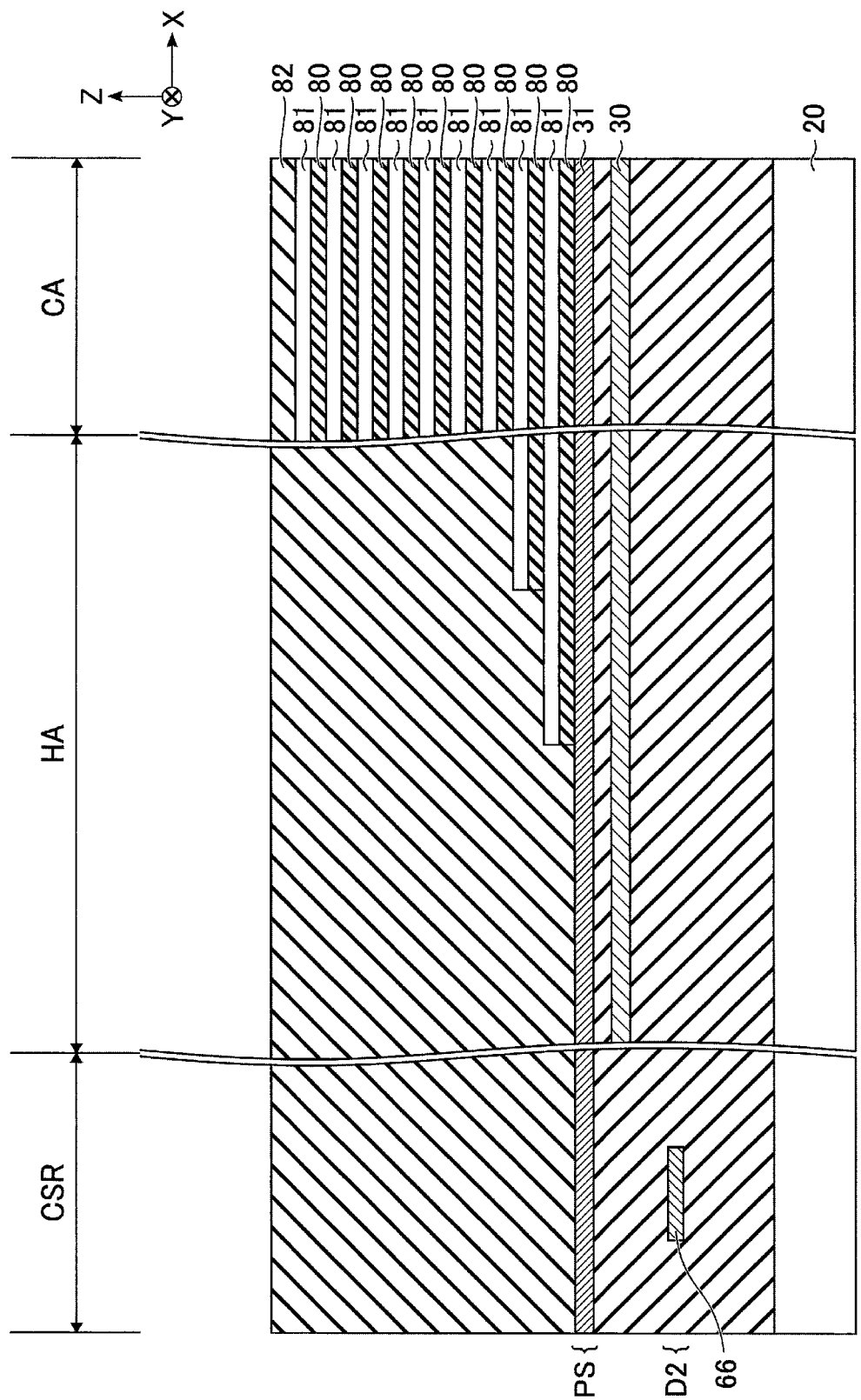

Next, a staircase part in the hookup area HA is formed by, for example, photolithography and etching, as shown in FIG. 13. Namely, a structure is formed in which a lower replacement member 81 out of two adjacent replacement members 81 has a part that does not overlap an upper replacement member 81. After the staircase part is formed, an insulator film 82 is formed on an entire surface of a wafer, and an upper face of the wafer is flattened by chemical mechanical polishing (CMP), etc.

Figure 14:
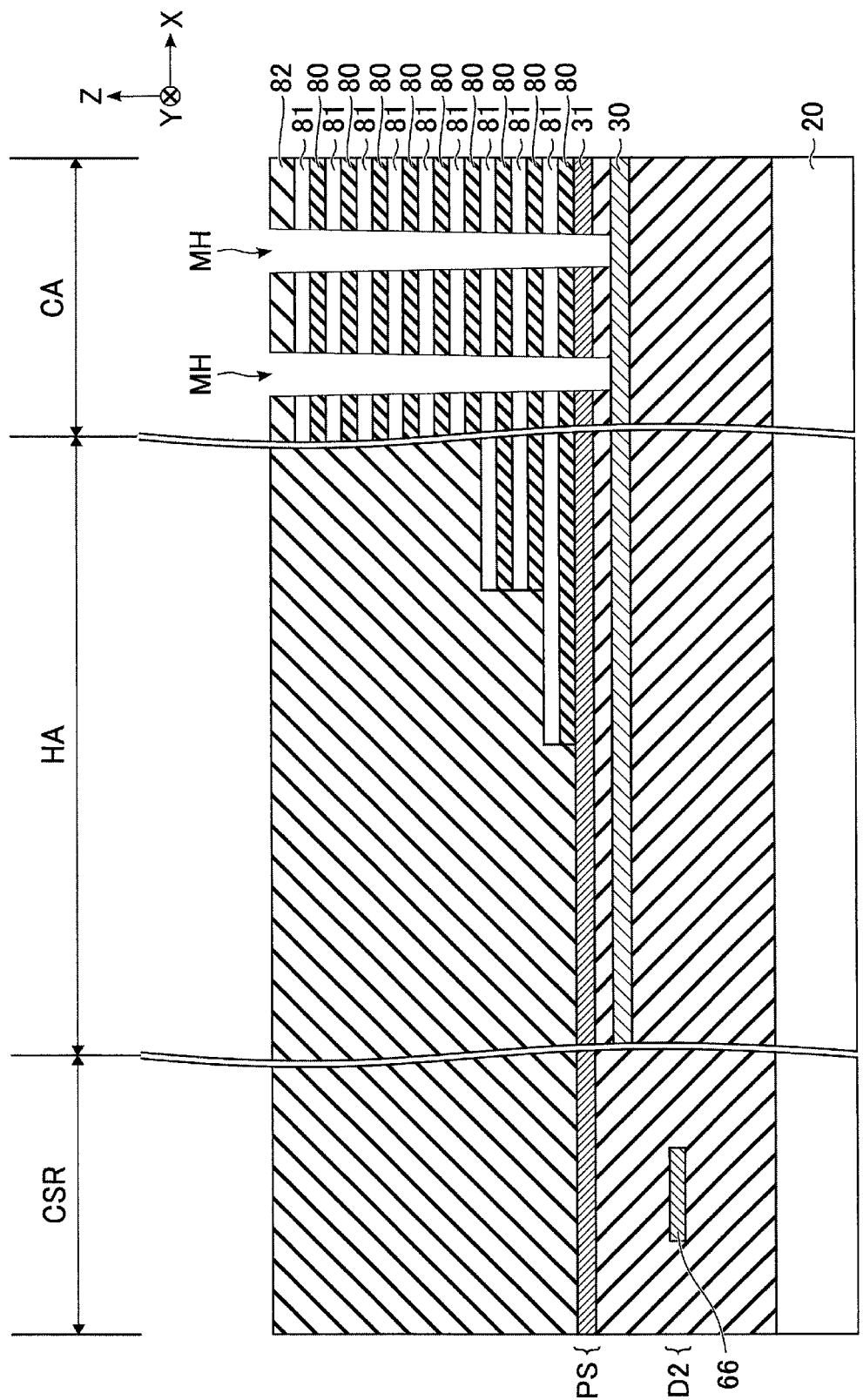

Next, the memory holes MH are formed in the cell area CA by anisotropic etching, as shown in FIG. 14. Specifically, the memory holes MH are formed by, for example, reactive ion etching (RIE), so as to penetrate (pass through) the plurality of insulator films 80, the plurality of replacement members 81, and the conductor 31, and reach an upper face of the conductor 30 from an upper face of the insulator film 82. One memory hole MH corresponds to one memory pillar MP.

In the anisotropic etching performed in this process, after the memory hole MH reaches the conductor 31 (e.g., polysilicon film), for example, the conductor 31 is etched, so that the memory hole MH penetrates the conductor 31. Thereafter, the insulator below the conductor 31 is etched, so that a bottom portion of the memory hole MH reaches the conductor 30. By using the conductor 31 as an etching stopper in this manner, lower ends of the memory holes MH are aligned, and the memory holes MH are inhibited from getting deeply into the conductor 30.

Figure 15:
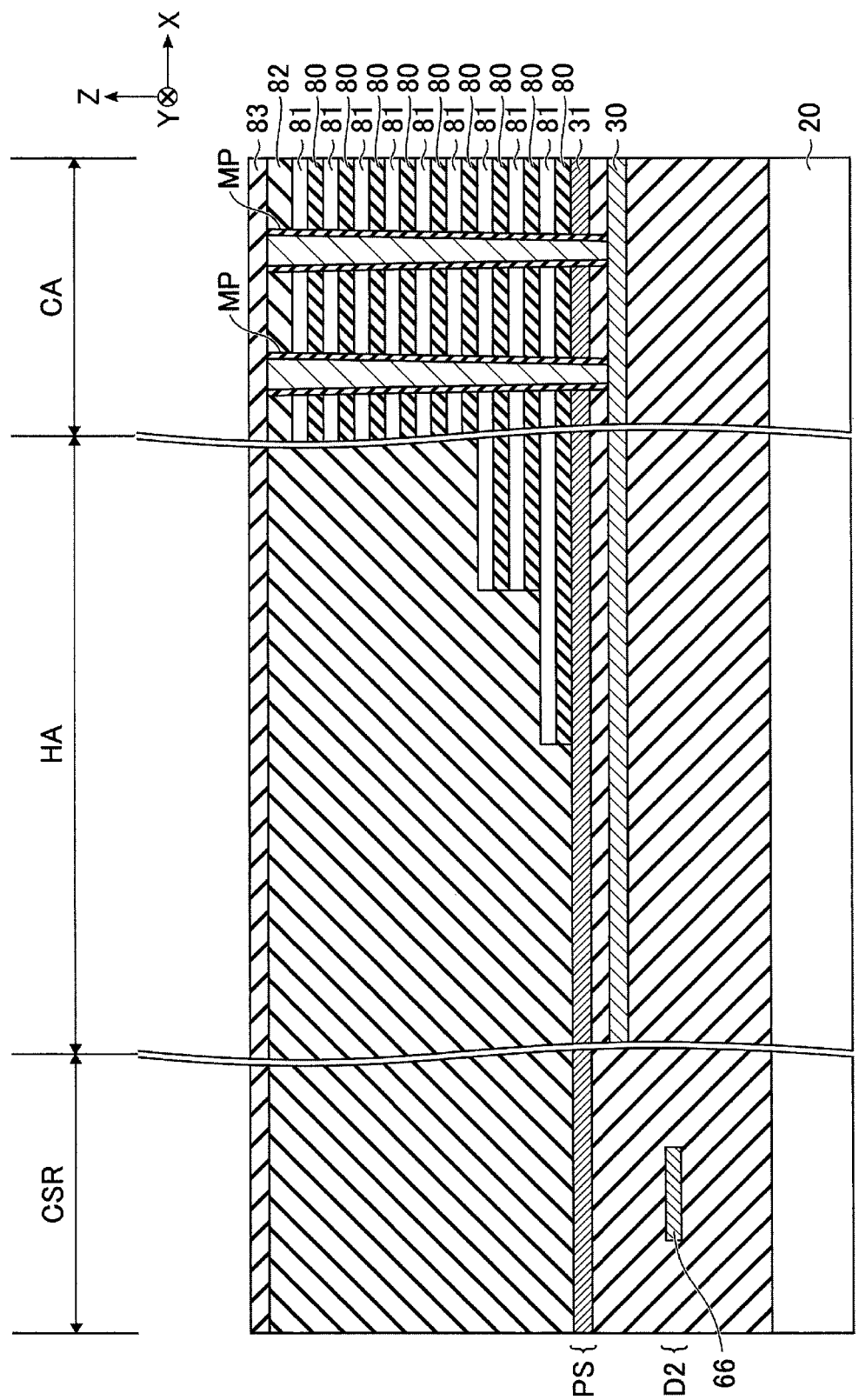

Next, the memory pillar MP is formed, and a protective film 83 is formed above an upper end of the memory pillar MP, as shown in FIG. 15. Specifically, the block insulator film 42, the insulator film 43, and the tunnel oxide film 44 in the memory pillar MP, which are described using FIG. 6, are formed in the memory hole MH in the mentioned order. After the bottom portion of the memory hole MH is etched, the semiconductor member 45 is formed in the memory hole MH; and after a portion of the semiconductor member 45 that is formed on an upper face of the memory hole MH, etc., is removed, the protective film 83 is formed. For example, tetraethoxysilane (TEOS) is used as the protective film 83. In the drawings that are referred to when describing the manufacturing processes, a detailed cross-sectional structure of the memory pillar MP is not shown.

Figure 16:
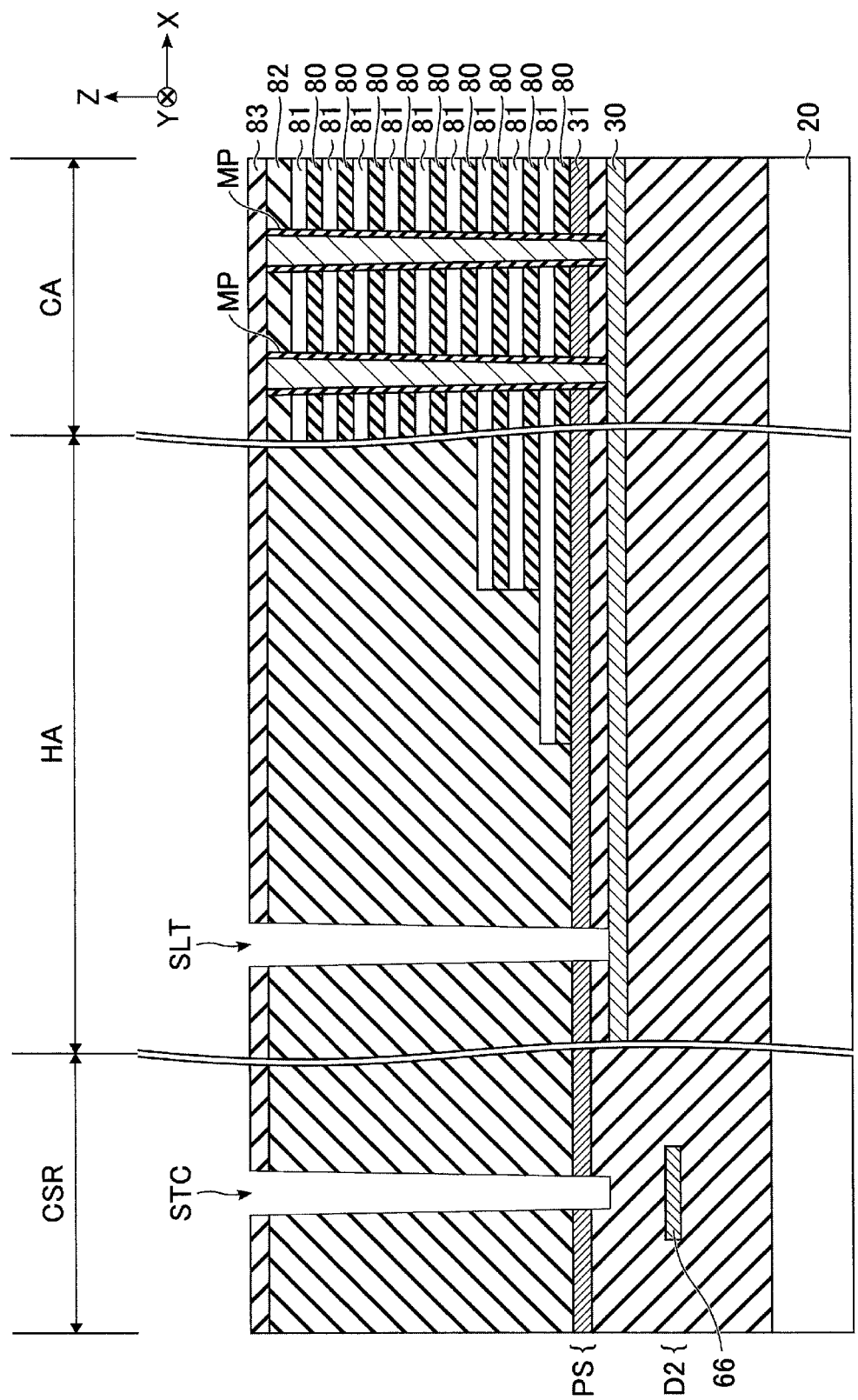

Next, as shown in FIG. 16, the slit SLT is formed in each of the cell area CA and the hookup area HA (the slit SLT in the cell area CA not shown in the drawing) by anisotropic etching, and the slit STC is formed in the crack stopper region CSR. In the anisotropic etching performed in this process, the RIE under the conditions that allow etching of the conductor 31 (e.g., silicon), for example, is performed.

The slit SLT splits a layer stack portion in which the insulator film 80 and the replacement member 81 are alternately stacked, and splits each of the protective film 83, insulator film 82, and conductor 31. The slit STC splits each of the protective film 83, insulator film 82, and conductor 31.

A bottom portion of the slit SLT reaches, for example, an upper face of the conductor 30. For example, a bottom portion of the slit STC is positioned between the interconnect layers D2 and PS, and the slit STC is formed so that an area formed by splitting the conductor 31 overlaps with the conductor 66.

The planar layout of the slits SLT and STC in this process is shown in FIG. 17. The region of the conductor 31 shown in FIG. 17 is the same as the region of the conductor 31 described using FIG. 8.

The slit SLT is formed to divide the string unit SU in the core region CR, as shown in FIG. 17. The slit STC is formed to correspond to the crack stopper CS in the crack stopper region CSR. One or more slits STC may be provided in the guard ring region GRR, as shown in FIG. 17.

Thereby, the slit SLT separates the conductor 31 corresponding to each string unit SU in the core region CR and the conductor 31 provided in the other regions, and the slit STC separates the conductor 31 provided in a region surrounded by the slit STC and the conductor 31 provided in an outer region of the slit STC.

Figure 18:
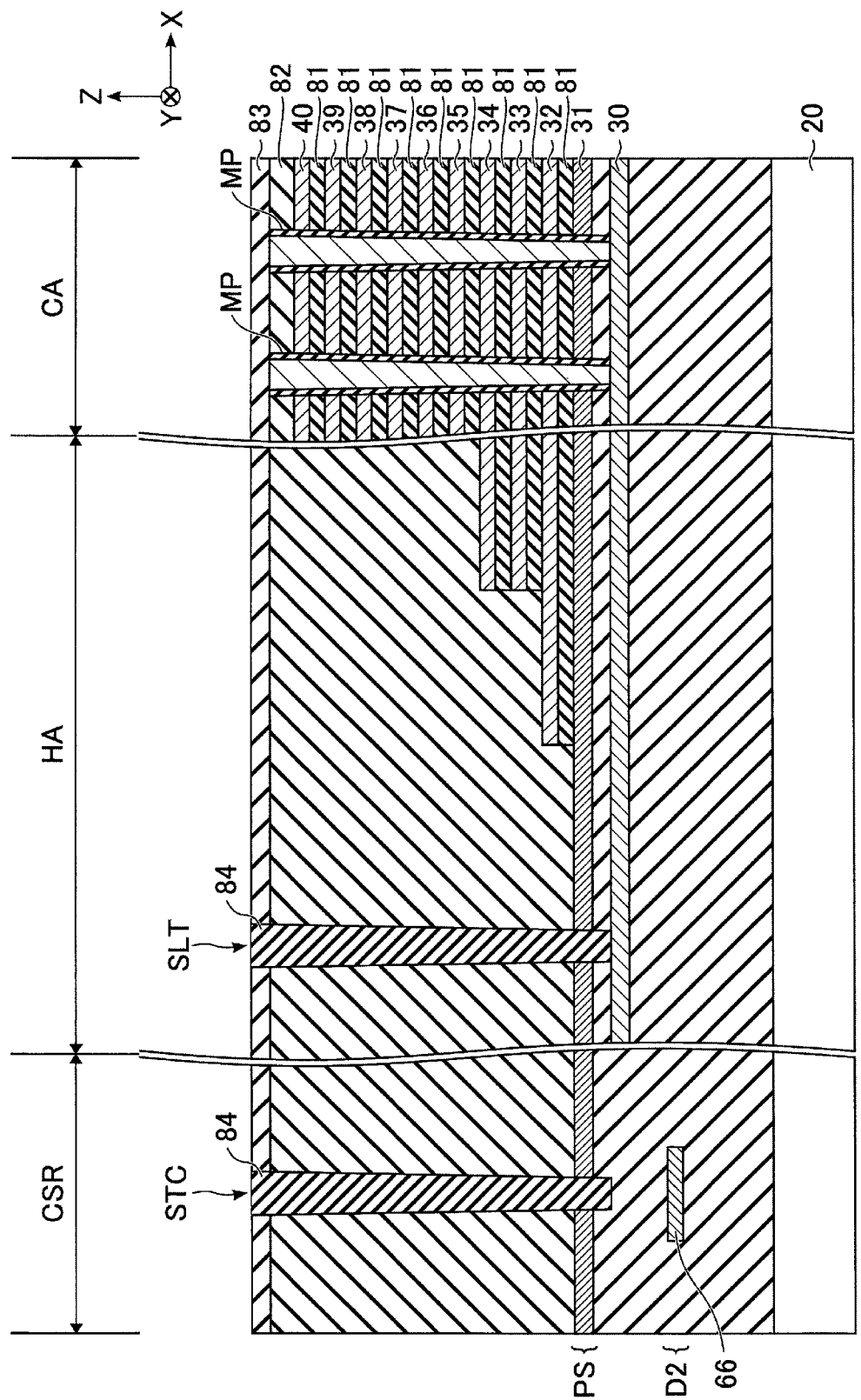
FIGS. 18 and 19 are cross-sectional views of the cell area, hookup area, and crack stopper region respectively showing an example of a process of manufacturing the semiconductor device according to the embodiment.

Next, the replacement member 81 is replaced by a conductor (conductive member), and an insulator 84 is formed in the slits SLT and STC, as shown in FIG. 18. To be specific, the replacement member 81 is removed by wet etching via the slit SLT first, and then a conductor is formed in a space created by the removal of the replacement member 81. The conductor formed in a space created by the removal of the replacement member 81 corresponds to, for example, the conductors 32 to 40 described using FIG. 6.

Then, the conductor formed on the protective film 83 and on the lateral faces of the slits SLT and STC is removed, and the inner parts of the slits SLT and STC are filled by the insulator 84. Also, a portion of the insulator 84 formed on the protective film 83 is removed by etch-back processing. For example, the insulator 84 is formed by the chemical vapor deposition (CVD), and silicon oxide SiO2 is used as the insulator 84.

Figure 19:
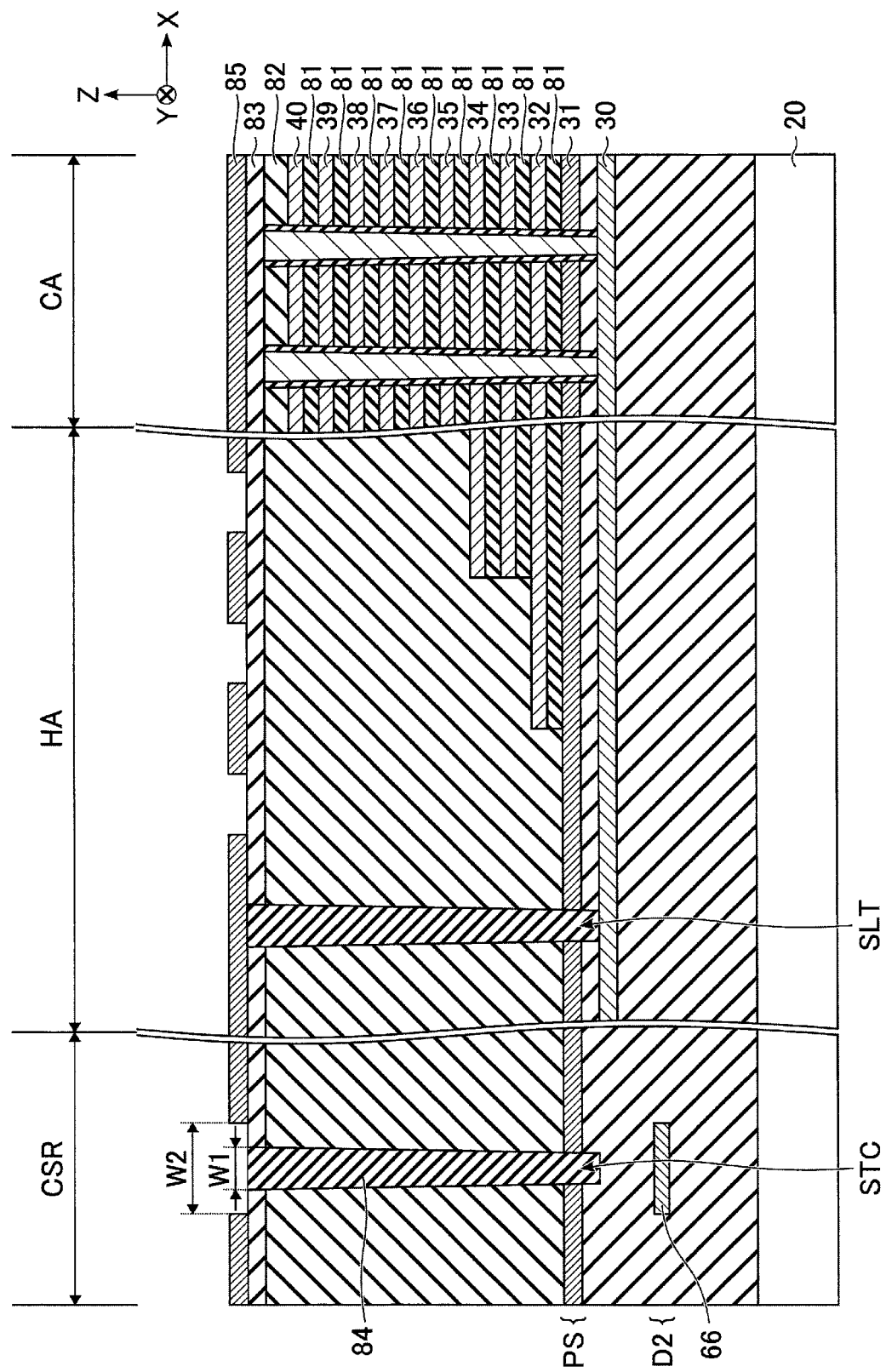

Next, a hard mask 85 is formed on the protective film 83, as shown in FIG. 19. Specifically, a material corresponding to the hard mask 85 is formed on the entire surface of the wafer, and is patterned into a desired shape by photolithography and anisotropic etching. For example, an inorganic material, such as tungsten, amorphous silicon, or sapphire, is used as the hard mask 85.

In this process, a linear opening corresponding to the contact C3 is provided on the slit STC in, for example, the crack stopper region CSR, and a dotted opening corresponding to the contact CC is provided at the staircase part of the hookup area HA. Also, a width W1 of an upper end of the slit STC as viewed in the X-direction is, for example, set to be smaller than a width W2 of a corresponding opening of the hard mask 85 as viewed in the X-direction.

FIG. 20 shows a planar layout of an area CSA included in the crack stopper region CSR shown in FIG. 17. In the area CSA, the hard mask 85 is, for example, opened so as to correspond to the crack stoppers CS1 and CS2, as shown in FIG. 20. Specifically, in the X-Y plane, the opening of the hard mask 85 is formed so as to include an upper end portion of the insulator 84 included in the corresponding slit STC.

Then, in the X-Y planar view, the opening of the hard mask 85 is formed to be wider than an area of the insulator 84 formed in the slit STC, and to include the area of the insulator 84 formed in the slit STC. In the other areas in the crack stopper region CSR as well, the hard mask 85 is formed to be opened at a portion of the crack stopper region CSR where the slit STC is formed.

Figure 21:
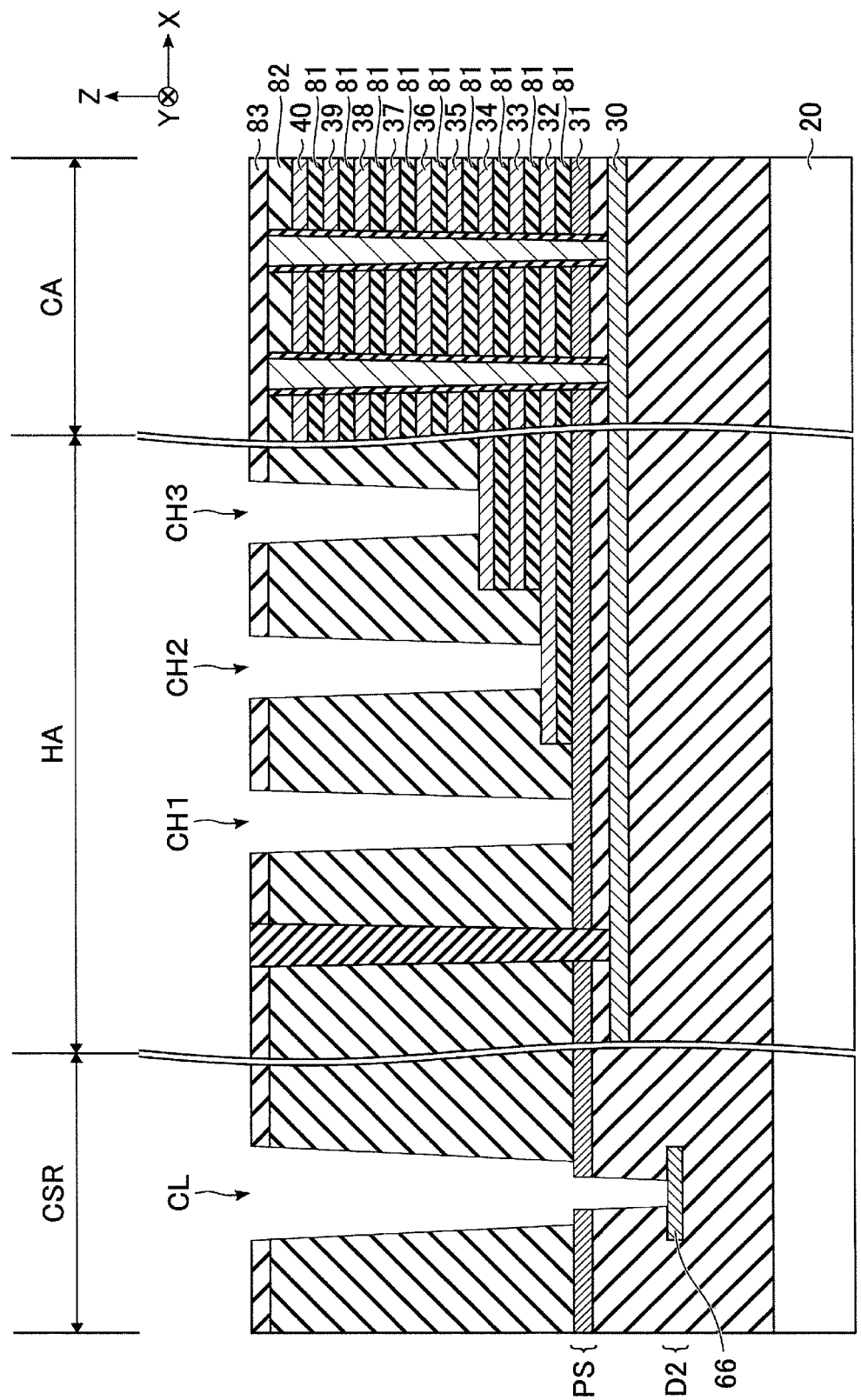
FIGS. 21, 22, 23, and 24 are cross-sectional views of the cell area, hookup area, and crack stopper region respectively showing an example of a process of manufacturing the semiconductor device according to the embodiment.

Next, the contact hole CH and the contact slit CL are formed by anisotropic etching using the hard mask 85, as shown in FIG. 21.

For example, the RIE is used in the anisotropic etching performed in this process. Etching conditions are set so that an etching rate of silicon oxide and an etching rate of silicon nitride become higher than an etching rate of silicon. Under such conditions, an etching rate for the conductor 31 (e.g., polysilicon) becomes significantly lower when the contact slit CL and the contact hole CH reach the conductor 31. Therefore, a line width of the contact slit CL differs, for example, between a portion above the interconnect layer PS and a portion below the interconnect layer PS.

By this process, a surface of a conductor corresponding to the contact hole CH is exposed to a bottom face of the contact hole CH. Specifically, the contact hole CH1 for forming the contact CC corresponding to the selection gate line SGS is, for example, formed so that the conductor 31 is exposed. The contact hole CH2 for forming the contact CC corresponding to the word line WL0 is formed so that the conductor 32 is exposed. The contact hole CH3 for forming the contact CC corresponding to the word line WL2 is formed so that the conductor 34 is exposed. A surface of the conductor 66 corresponding to the contact slit CL is exposed to a bottom face of the contact slit CL.

Figure 22:
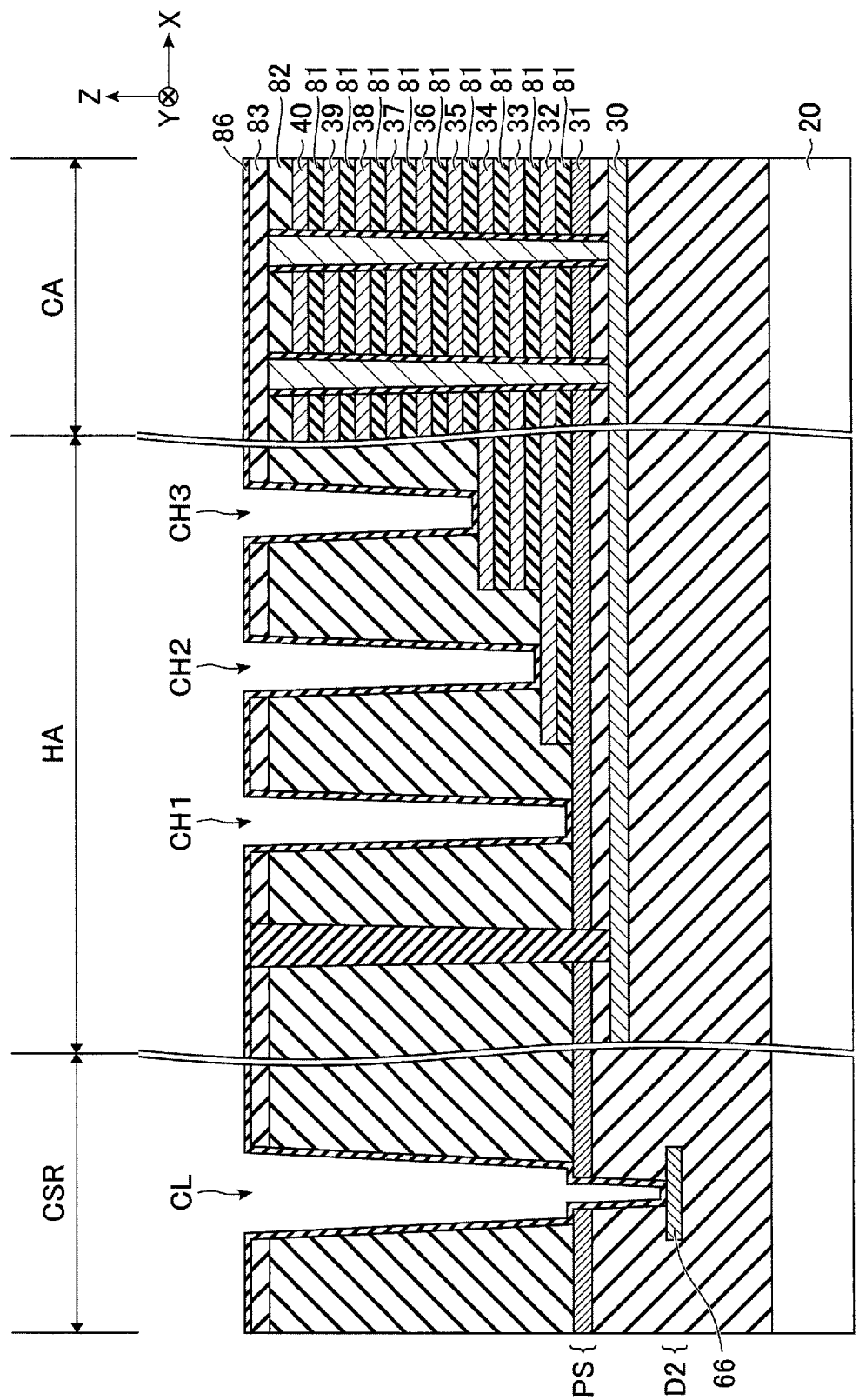

Next, an insulator film 86 is formed on the upper face of the wafer, an inner wall of the contact slit CL, and an inner wall of the contact hole CH, as shown in FIG. 22. The insulator film 86 corresponds to the respective spacers of the contacts CC and C3, and the CVD, for example, is used to form the insulator film 86.

Figure 23:
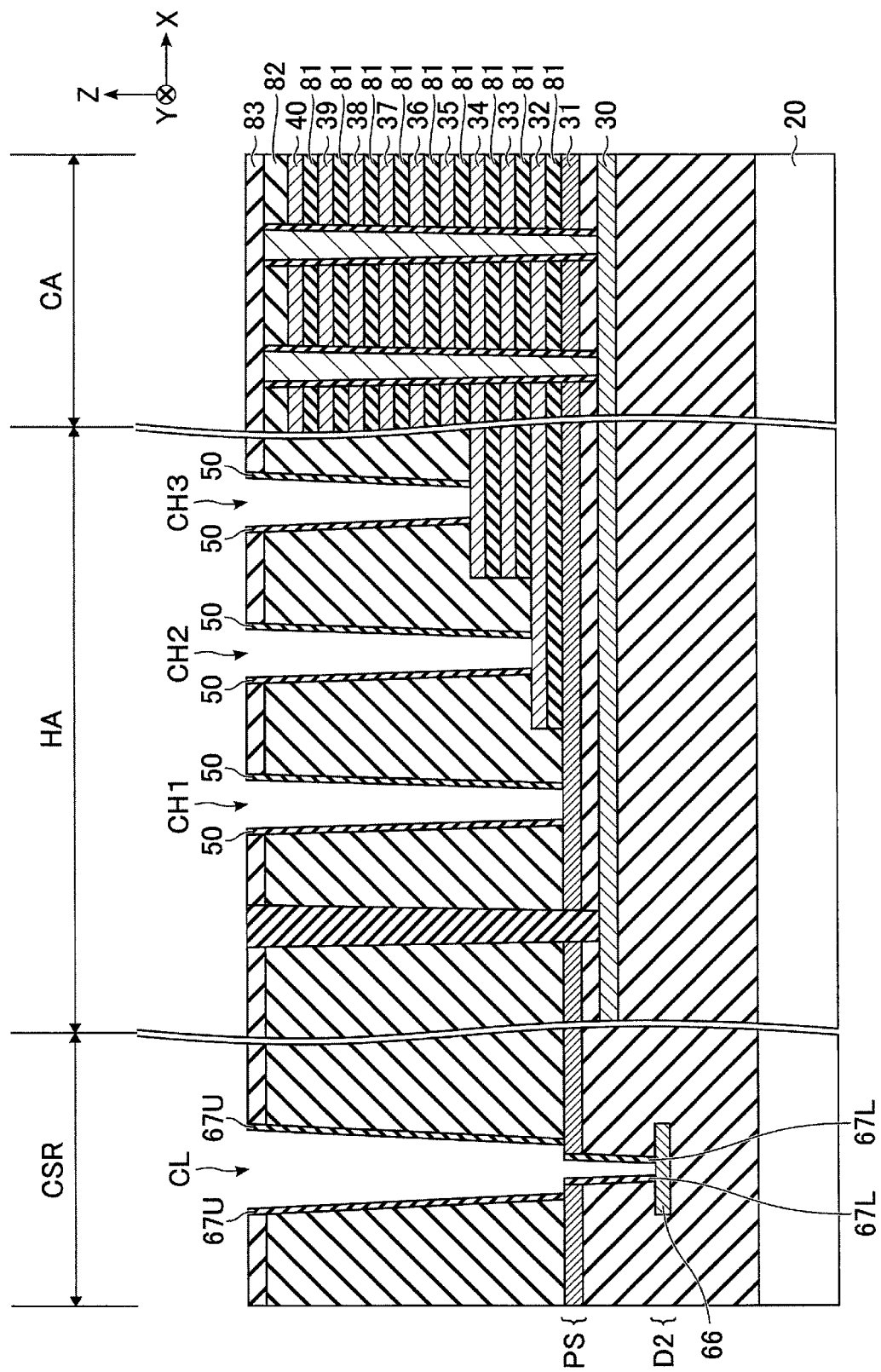

Next, the portions of the insulator film 86 that are respectively provided on the upper face of the wafer, a bottom portion of the contact slit CL, and a bottom portion of each of the contact holes CH are removed by anisotropic etching such as the RIE, as shown in FIG. 23. Thereby, the portion of the insulator film 86 that is formed on the protective film 83 is removed, the conductor 66 is exposed at the bottom portion of the contact slit CL, and the conductors corresponding to the contact holes CH are exposed at the bottom portions of the contact holes CH.

The insulator film 86 split by this process corresponds to the spacer 50 of the contact CC described using FIG. 7 in the hookup area HA, and corresponds to the spacer 67 of the contact C3 described using FIG. 9 in the crack stopper region CSR.

Figure 24:
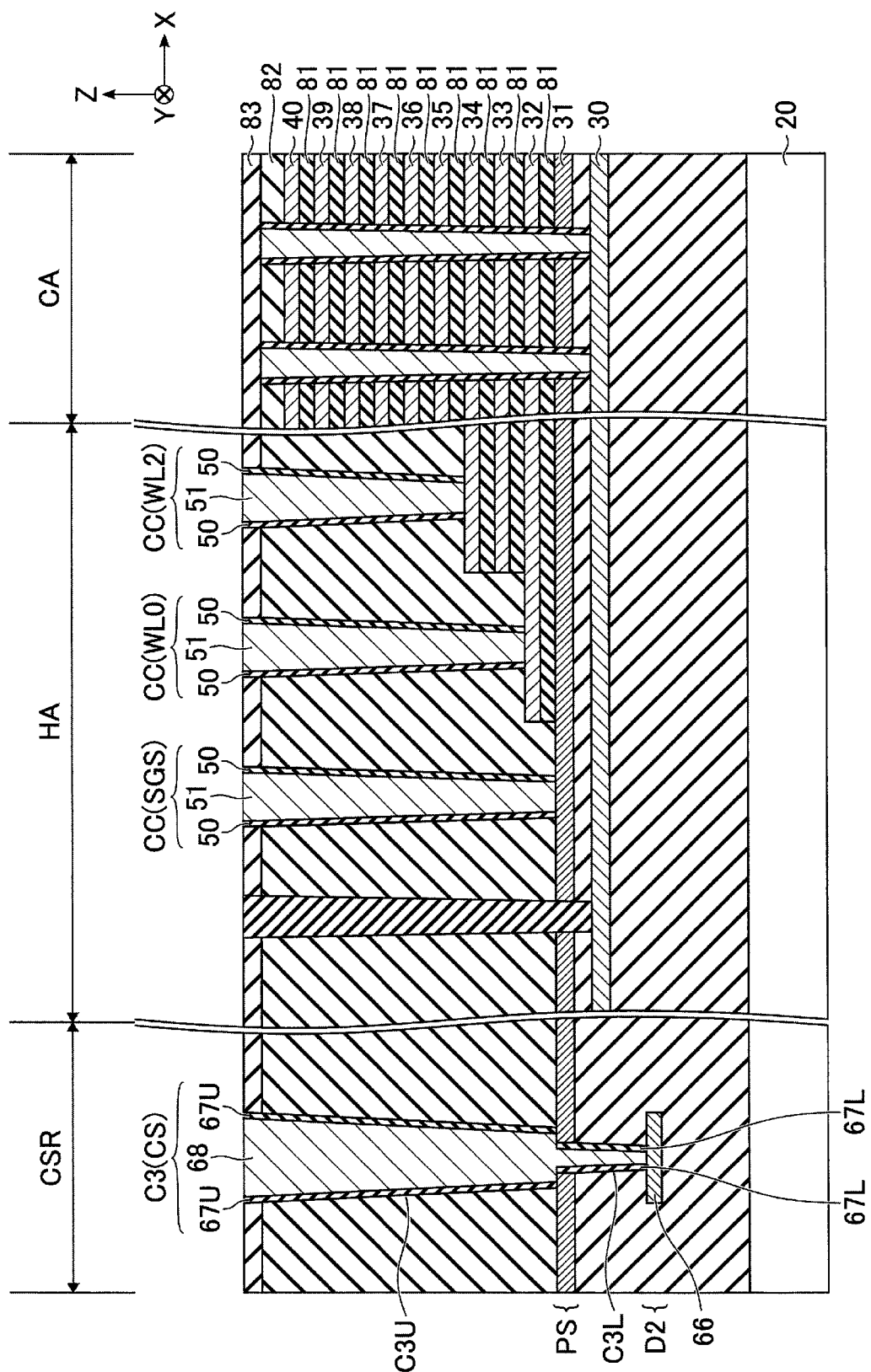

Next, a conductor is formed inside the contact slit CL and inside the contact holes CH, and a conductor formed above the wafer is removed, as shown in FIG. 24. Specifically, processing of depositing metal corresponding to the contacts CC and C3 is performed. After the metal is deposited, an upper face of a structure is flattened by the CMP, etc., and the metal deposited outside the contact holes CH and the contact slit CL is removed.

Thereby, the conductor 68 is formed inside the contact slit CL, and a structure of the contact C3 electrically coupled with the conductor 66 at a bottom face of the contact C3 is formed. The conductor 51 is formed inside the contact hole CH, and a structure of the contact CC electrically coupled with the corresponding conductor at a bottom face of the contact CC is formed.

By the above-described manufacturing processes, various interconnects and the contacts CC and C3 of the semiconductor device 1 are formed. The above-described manufacturing process is merely an example, and other processing may be inserted between the respective processes.

[1-3] Advantageous Effects of Embodiment

According to the semiconductor device 1 of the embodiment described above, the yield of the semiconductor device 1 can be improved. Advantageous effects of the semiconductor device 1 according to the embodiment will be detailed below.

In a process of manufacturing a semiconductor memory device having three-dimensionally stacked memory cells, a memory hole is formed in a layer stack in which, for example, two types of members are alternately stacked, and a semiconductor member to be a channel of the memory cells is formed in the memory hole.

In an etching process to form this memory hole, a positive charge is accumulated at a bottom portion of the memory hole as the etching progresses, and a conductor (e.g., source line) reached by the bottom portion of the memory hole may be positively charged. Thus, arcing may occur between the positively-charged conductor and a negatively-charged silicon wafer.

To address this drawback, in the semiconductor device 1 according to the embodiment, the conductor 31 is inserted in the layer stack where the memory hole MH is to be formed. Also, in the etching process to form the memory hole MH, among the processes of manufacturing the semiconductor device 1 according to the embodiment, the conductor 31 in the region RG0 (core region CR) and the conductor 31 in the region RG2 (outer periphery of the semiconductor substrate 20) shown in FIG. 8 have a structure of being electrically coupled to each other.

In this case, in the etching process to form the memory hole MH, when the bottom portion of the memory hole MH reaches the conductor 31, the positive charge accumulated at the bottom portion of the memory hole MH is discharged to a surface of a structure formed on a silicon wafer via the regions RG1, RG2, and LP1 through LP4 of the conductor 31.

As a result, in the method of manufacturing the semiconductor device 1 according to the embodiment, the positive charge accumulated in the etching process to form the memory hole MH is suppressed from being accumulated in the conductor 31 in the core region CR, and an occurrence of arcing is suppressed.

Also, the conductor 31 to be used as the selection gate line SGS in each string unit SU, and the conductor 31 formed in the other regions, are separated from each other by the process of forming the slit SLT after forming the memory hole MH, as shown in FIG. 17. Therefore, the conductor 31 to be used as the selection gate line SGS is electrically insulated from the conductor 31 provided in the other regions, and can be used to control the semiconductor device 1.

In the semiconductor device 1 according to the embodiment, the conductor 31 for dealing with the arcing described above is also formed in a peripheral area of the semiconductor substrate 20. The crack stopper CS to be used for such purposes as preventing generation of a crack, preventing entry of moisture, etc., coupling an interconnect in an upper layer to the well region of the semiconductor substrate 20, and suppressing stress in the interlayer insulator film, is formed in the peripheral area of the semiconductor substrate 20.

In the method of manufacturing the semiconductor device 1 according to the embodiment, the process of forming the contact C3 in the crack stopper CS and the process of forming the contact CC corresponding to the word line WL, etc., are performed at the same time.

Specifically, in the method of manufacturing the semiconductor device 1 according to the embodiment, the slit STC that splits the conductor 31 provided in the peripheral area is also formed at the same time in the process of forming the slit SLT for forming the conductor corresponding to the word line WL, etc.

This slit STC is formed to overlap with the conductor 66 in the X-Y planar view, for example, and splits the conductor 31 in an upper area of the conductor 66. The formed slit STC, as well as the slit SLT, is filled with the insulator 84.

Then, the hard mask is formed that has an opening in each of the areas where the contact CC for drawing the interconnect corresponding to the word lines WL, etc., and the area having a width larger than that of the slit STC and including the part where the slit STC is formed.

Thereafter, the anisotropic etching is performed, to form each of the contact slit CL where a surface of the conductor 66 is exposed via the area of a split formed by the slit STC, and the contact hole CH where a surface of the conductor corresponding to the word line WL, etc., is exposed, and to form the contacts C3 and CC in the formed contact slit CL and contact hole CH, respectively.

As described above, the method of manufacturing the semiconductor device 1 according to the embodiment can form the contacts C3 and CC in one process by splitting the conductor 31 using the slit STC. Namely, the method of manufacturing the semiconductor device 1 according to the embodiment can simplify the manufacturing process, and can reduce the manufacturing costs.

The contact C3 formed by the method of manufacturing the semiconductor device 1 according to the embodiment has a structure in which a width thereof differs between a portion above a face that is parallel to the X-Y plane and is included in the interconnect layer PS where the conductor 31 is formed, and a portion below the face.

It is possible to increase the width of the slit STC to form a contact slit CL that is narrower than the slit STC; however, to provide the contact slit CL in the slit STC has negative effects when misalignment occurs in the lithography process at the time of forming the hard mask or a twist is made at the time of forming the contact slit CL. Also, if the width of the slit STC is increased, the filling amount in the process of filling the insulator 84 into the slit STC and the etch-back amount as described using FIG. 18 increases, causing the manufacturing costs to increase.

On the other hand, in the semiconductor device 1 according to the embodiment, it is sufficient as long as the opening of the hard mask formed at the time of processing the contact slit CL is provided so as to overlap at least the area formed by splitting the conductor 31 using the slit STC; and superposition on the conductor 66 is performed by self-alignment.

As a result, the method of manufacturing the semiconductor device 1 according to the embodiment can increase the flexibility at the time of processing the contact slit CL and can decrease the difficulty of the process. Accordingly, the semiconductor device 1 according to the embodiment can suppress generation of a defect caused by high process difficulty, thereby improving the yield of the semiconductor device 1.

[2] Modification, Etc

A semiconductor device according to an embodiment includes a substrate, first to third conductors, and first and second contacts. The substrate includes a core region, and a peripheral area surrounding an outer periphery of the core region. The first conductor is provided in a first layer above the substrate in the core region. The first contact extends in a first direction intersecting with a surface of the substrate, and is provided on the first conductor. The second conductor is provided in the first layer and is insulated from the first conductor in the peripheral area. The third conductor is provided between the second conductor and the substrate. The second contact extends in the first direction through the second conductor, and is provided on the third conductor. A width of the second contact, as viewed in a second direction parallel to the surface of the substrate, differs between a portion above a boundary face that is included in the first layer and is parallel to the surface of the substrate, and a portion below the boundary face. Thereby, the semiconductor device 1 can improve the yield at the time of manufacturing the semiconductor device 1.

In the embodiment, the shape of the boundary part BP between the contacts C3U and C3L may be different from the shape described using FIG. 9, depending on the progression of the etching at the time of forming the contact slit CL. Examples of other shapes of the boundary part BP of the contact C3 will be described with reference to FIGS. 25 and 26.

Figure 25:
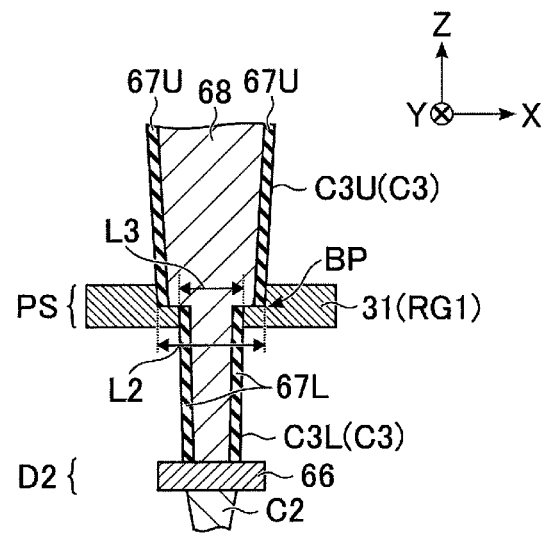
FIG. 25 is a cross-sectional diagram showing an example of a cross-sectional structure of the crack stopper region in a first modification of the embodiment.

FIG. 25 shows an example of a structure in which the boundary part BP between the contacts C3U and C3L penetrates into the middle of the conductor 31. The conductor 31 used as an etching stopper may be etched slowly when the selectivity is low. Therefore, the boundary part BP may penetrate into the middle of the conductor 31, as shown in FIG. 25.

Figure 26:
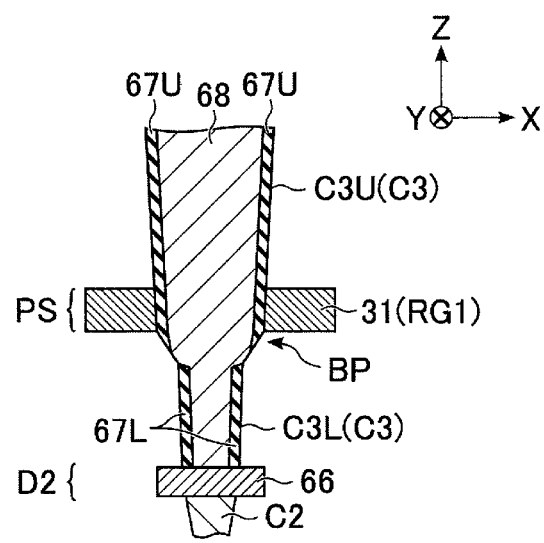
FIG. 26 is a cross-sectional diagram showing an example of a cross-sectional structure of the crack stopper region in a second modification of the embodiment.

FIG. 26 shows an example of a structure in which the boundary part BP between the contacts C3U and C3L gets into a bottom face of the conductor 31. If the etching time is long or if the etching selectivity is small when forming the contact slit CL, a bottom portion of the contact C3U may reach the bottom face of the conductor 31, as shown in FIG. 26.

In the case of the structure of the contact C3 shown in FIG. 26, the spacer 67U formed on a sidewall of the contact C3U insulates the conductor 68 and the conductor 31 from each other, and a portion of the conductor 68 at the boundary part BP is in contact with an insulator film provided between the interconnect layers D2 and PS and penetrated by the contact C3. Namely, in the structure of the contact C3 shown in FIG. 26, the conductor 68 in the contact C3 is electrically insulated from the conductor 31, and is electrically coupled with the conductor 66 at a bottom portion of the contact C3. Even with the structures of the contact C3 shown in FIGS. 25 and 26, the semiconductor device 1 according to the embodiment can achieve advantageous effects similar to those described in the above embodiment.

In the embodiment, the case where the crack stopper CS is formed in a shape of a quadrilateral ring completely surrounding the outer periphery of the core region CR is described as an example. However, the embodiment is not limited thereto. For example, in the crack stopper CS, a split portion may be included in the contact C3 provided in a ring shape, or a portion formed in a columnar shape may be included therein. Namely, it is sufficient as long as the contact C3 in the crack stopper CS is formed so as to surround at least the outer periphery of the core region CR.

In the embodiment, the case where the crack stopper CS has a structure in which there is electrical coupling from the well regions 60 and 61 in the semiconductor substrate 20 to an interconnect of the interconnect layer M2 via the contact C3 is described. However, the embodiment is not limited thereto. For example, in the case of forming a structure intended to alleviate the stress of the insulator film 82 on the staircase part in the hookup area HA, it is unnecessary to provide an interconnect coupled to a layer above the contact C3. Namely, as long as the crack stopper CS can fully exhibit the effects, such as preventing entry of moisture, it need not necessarily be coupled to the uppermost interconnect layer (e.g., M2), and it is sufficient as long as at least contact C3 is formed.

The number of crack stoppers CS described in the embodiment is merely an example. Any number of crack stoppers CS may be set for the semiconductor device 1. If a plurality of crack stoppers CS are formed, the respective crack stoppers CS may be provided in different structures. For example, a crack stopper CS in which an upper interconnect is coupled to the contact C3 and a crack stopper CS in which an upper interconnect is not coupled to the contact C3 may coexist in the semiconductor device 1.

In the embodiment, the case where the contact C3 is formed so as to correspond to all of the slits STC formed in the crack stopper region CSR is described as an example. However, the embodiment is not limited thereto. For example, a slit STC where the contact C3 is not formed may be included in the peripheral area of the semiconductor substrate 20 including the crack stopper region CSR. For example, several slits STC as described above may be respectively arranged on an inner side and outer side of the crack stoppers CS1 and CS2 described in the embodiment.

In the embodiment, the case where the lateral face of the contact C3U is tapered in such a manner that the width thereof is decreased as it comes closer to the substrate side is described as an example. However, the embodiment is not limited thereto. For example, the contact C3U may be barrel-shaped so that it has a swollen part in the middle, or may be reverse-tapered so that a diameter of the contact C3U increases as it comes closer to a lower side. In this case as well, the width of the contact C3 differs between the portion above the boundary part BP between the contacts C3U and C3L, and the portion below the boundary part BP.

In the embodiment, the case where the spacer 67 is provided to a sidewall portion of the contact C3 and where the spacer 50 is provided to a sidewall portion of the contact CC is described as an example. However, the embodiment is not limited thereto. For example, if it is possible to fully ensure a withstand voltage between the contact CC and the staircase parts of the conductors in the hookup area HA, formation of the spacer 67 of the contact C3 and the spacer 50 of the contact CC may be omitted.

In the embodiment, the semiconductor memory in which the memory cell transistors MT with a charge storage layer are three-dimensionally arranged is described. However, the embodiment is not limited thereto. The structure of the crack stopper region CSR and the manufacturing processes described in the above embodiment may also be applied to other semiconductor devices. For example, the structure of the crack stopper region CSR and the manufacturing processes described in the above embodiment may be applied to a semiconductor memory device in which phase-change memory cells are three-dimensionally arranged, or may be applied to a semiconductor memory device in which memory cells that use a ferroelectric thin film material are three-dimensionally arranged.

Additionally, the memory cell array 10 may have other configurations. Another configuration of the memory cell array 10 is disclosed, for example, in U.S. patent application Ser. No. 12/407,403 filed Mar. 19, 2009 and entitled "THREE DIMENSIONAL STACKED NONVOLATILE SEMICONDUCTOR MEMORY." In addition, other configurations of the memory cell array 10 are disclosed in U.S. patent application Ser. No. 12/406,524 filed Mar. 18, 2009 and entitled "THREE DIMENSIONAL STACKED NON-VOLATILE SEMICONDUCTOR MEMORY", U.S. patent application Ser. No. 12/679,991 filed Mar. 25, 2010 and entitled "NONVOLATILE SEMICONDUCTOR STORAGE DEVICE AND MANUFACTURING METHOD THEREOF", and U.S. patent application Ser. No. 12/532,030 filed Mar. 23, 2009 and entitled "SEMICONDUCTOR MEMORY AND METHOD FOR MANUFACTURING SAME." The entirety of these patent applications is incorporated in the present specification by reference.

In the present description, the term "couple" means electrical coupling, and does not exclude, for example, a case where elements are coupled via another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate comprising a core region, and a peripheral area surrounding an outer periphery of the core region, the core region including three-dimensionally stacked memory cells;
   a first conductor in a first layer above the substrate in the core region of the substrate;
   a first contact on the first conductor, the first contact extending in a first direction intersecting with a surface of the substrate;
   a second conductor in the first layer in the peripheral area of the substrate and is insulated from the first conductor;
   a third conductor between the second conductor and the substrate; and
   a second contact on the third conductor, the second contact extending in the first direction through the second conductor, wherein
   a width of the second contact as viewed in a second direction parallel to the surface of the substrate differs between a portion above a boundary face and a portion below the boundary face, the boundary face being included in the first layer and parallel to the surface of the substrate, and
   the second contact includes:
      a fourth conductor extending in the first direction through a first portion and a second portion, the first portion being positioned farther from the substrate than the boundary face is and the second portion being positioned closer to the substrate than the boundary face is;
      a first insulator film on a lateral face of the fourth conductor in the first portion; and
      a second insulator film on a lateral face of the fourth conductor in the second portion, the second insulator film being separated from the first insulator film.

2. The device of claim 1, wherein the width of the second contact as viewed in the second direction non-sequentially varies between a portion above the boundary face and a portion below the boundary face.

3. The device of claim 1, wherein each of the second conductor, the third conductor, and the second contact surrounds the core region.

4. The device of claim 3, wherein a cross section of the second contact taken along a face parallel to the surface of the substrate has an annular shape.

5. The device of claim 4, further comprising:
a sixth conductor that surrounds an outer periphery of the second conductor in the first layer in the peripheral area of the substrate,
wherein a cross section of the sixth conductor taken along a face parallel to the surface of the substrate has an annular shape.

6. The device of claim 5, further comprising a portion in the first layer connecting the second conductor and the sixth conductor.

7. The device of claim 1, wherein
a cross section of the first portion at the boundary face parallel to the surface of the substrate has a first width viewed in the second direction, and
a cross section of the second portion at the boundary face has a second width viewed in the second direction, the first width being larger than the second width.

8. The device of claim 7, wherein the fourth conductor is electrically coupled to the second conductor at the boundary face and is electrically coupled to the third conductor at a bottom portion of the second contact.

9. The device of claim 1, further comprising:
a third insulator film between the second conductor and the third conductor, the third insulator film being penetrated by the second contact and being in contact with the fourth conductor,
wherein the fourth conductor is electrically insulated from the second conductor and is electrically coupled to the third conductor at a bottom portion of the second contact.

10. The device of claim 1, further comprising:
a plurality of fifth conductors that are stacked above the first conductor with an insulator interposed between the fifth conductors; and
a memory pillar that penetrates the first conductor and the plurality of fifth conductors in the first direction,
wherein a portion of the memory pillar that intersects with one of the plurality of fifth conductors functions as a memory cell.

11. The device of claim 10, wherein a layer provided with a portion of the second contact that is positioned farther from the substrate than the boundary face is includes a layer comprising the plurality of fifth conductors that are stacked.

12. The device of claim 1, wherein each of the first conductor and the second conductor includes silicon.

13. The device of claim 1, wherein:
the substrate includes an N-type well region and a P-type well region; and
the third conductor is electrically coupled to the N-type well region or the P-type well region.

14. The device of claim 13, wherein:
the third conductor is more than one, the more than one third conductor including one third conductor that is electrically coupled to one of the N-type well region and the P-type well region and another third conductor that is electrically coupled to a remaining one of the N-type well region and the P-type well region; and
the second contact is more than one, the more than one second contact including one second contact that is provided on said one third conductor and another second contact that is provided on said another third conductor.

15. The device of claim 14, wherein:
each of the second conductor, the third conductor, and the second contact surrounds the core region;
said one third conductor among the more than one third conductor surrounds said another third conductor; and
said one second contact among the more than one second contact surrounds said another second contact.

16. The device of claim 15, wherein the more than one second contact is provided to penetrate the second conductor.

17. The device of claim 1, wherein ground potential is supplied to the second conductor.

* * * * *